(12) United States Patent
Lu et al.

(10) Patent No.: US 12,114,481 B2
(45) Date of Patent: Oct. 8, 2024

(54) METHOD FOR MANUFACTURING SEMICONDUCTOR STRUCTURE HAVING CONDUCTIVE BLOCK CONNECTED TO TRANSISTOR ON THE SUBSTRATE

(71) Applicant: CHANGXIN MEMORY TECHNOLOGIES, INC., Hefei (CN)

(72) Inventors: Jingwen Lu, Hefei (CN); Hai-Han Hung, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 491 days.

(21) Appl. No.: 17/456,480

(22) Filed: Nov. 24, 2021

(65) Prior Publication Data

US 2022/0310619 A1 Sep. 29, 2022

Related U.S. Application Data

(63) Continuation of application No. PCT/CN2021/110985, filed on Aug. 5, 2021.

(30) Foreign Application Priority Data

Mar. 25, 2021 (CN) .......................... 202110319528.5

(51) Int. Cl.
*H10B 12/00* (2023.01)
(52) U.S. Cl.
CPC ........... *H10B 12/312* (2023.02); *H10B 12/03* (2023.02); *H10B 12/482* (2023.02); *H10B 12/485* (2023.02)

(58) Field of Classification Search
CPC .... H10B 12/03; H10B 12/312; H10B 12/482; H10B 12/485
(Continued)

(56) References Cited

U.S. PATENT DOCUMENTS

2002/0115256 A1\* 8/2002 Lee .................. H01L 21/76895
257/E21.59
2005/0095794 A1 5/2005 Park

FOREIGN PATENT DOCUMENTS

CN 103383935 A 11/2013
CN 108074866 A 5/2018
(Continued)

OTHER PUBLICATIONS

International Search Report cited in PCT/CN2021/110985, mailed Nov. 29, 2021, 10 pages.

*Primary Examiner* — Hoai V Pham
(74) *Attorney, Agent, or Firm* — Kilpatrick Townsend & Stockton LLP

(57) ABSTRACT

The embodiments of the present disclosure belong to the field of semiconductor manufacturing technology and relates to a method for manufacturing a semiconductor structure and a semiconductor structure. The method for manufacturing the semiconductor structure includes: a bit line structure is formed on a substrate, a fill channel is formed between the insulating structures on two adjacent bit lines; a conductor is formed within the fill channel; at least one slit is formed on the conductor along a direction perpendicular to a longitudinal direction of each of the plurality of bit line to divide the conductor into a plurality of conductive blocks, each of the plurality of conductive blocks is connected to one of transistors on the substrate.

14 Claims, 25 Drawing Sheets

(58) Field of Classification Search
USPC .......................................................... 438/262
See application file for complete search history.

(56) References Cited

FOREIGN PATENT DOCUMENTS

| | | | |
|---|---|---|---|
| CN | 108091555 | A | 5/2018 |
| CN | 109256382 | A | 1/2019 |
| CN | 110010604 | A | 7/2019 |
| CN | 110718501 | A | 1/2020 |
| CN | 111430226 | A | 7/2020 |
| CN | 112086456 | A | 12/2020 |
| CN | 112447604 | A | 3/2021 |
| CN | 113078114 | A | 7/2021 |
| CN | 114068544 | A | 2/2022 |
| WO | 2019040046 | A1 | 2/2019 |

* cited by examiner

METHOD FOR MANUFACTURING SEMICONDUCTOR STRUCTURE HAVING CONDUCTIVE BLOCK CONNECTED TO TRANSISTOR ON THE SUBSTRATE

CROSS-REFERENCE TO RELATED APPLICATIONS

This is a continuation of International Patent Application No. PCT/CN2021/110985, filed on Aug. 5, 2021, which claims priority to Chinese Patent Application No. 202110319528.5, filed on Mar. 25, 2021 and entitled "Method for Manufacturing Semiconductor Structure and Semiconductor Structure". The disclosures of International Patent Application No. PCT/CN2021/110985 and Chinese Patent Application No. 202110319528.5 are hereby incorporated by reference in their entireties.

TECHNICAL FIELD

The embodiments of the present disclosure relates to the field of semiconductor manufacturing technology, and particularly to a method for manufacturing a semiconductor structure and a semiconductor structure.

BACKGROUND

With gradual development of storage device technology, a Dynamic Random Access Memory (DRAM) is gradually applied in various electronic devices with its higher density and faster reading and writing speed. The DRAM typically includes a capacitor structure and a transistor structure, and the transistor structure is connected to the capacitor structure so as to read data stored in the capacitor structure or write data into the capacitor structure through the transistor structure.

In related technologies, the transistor structure includes a substrate, an insulating structure is provided on the substrate, the insulating structure has a plurality of holes extending to the substrate thereon, each of the holes is filled therein with a capacitor connection line so that the transistor can be connected to the capacitor structure through the capacitor connection line to achieve data reading and writing. In the manufacturing process, the insulating structure is firstly formed on the substrate, and the plurality of holes are formed on the insulating structure, then a deposition method is adopted to deposit a conductive material in the hole so as to form the capacitor connection line in the hole.

However, the deposition method used to form the capacitor connection line is likely to form a gap in the capacitor connection line, which affects the performance of the DRAM.

SUMMARY

According to some embodiments, a first aspect of the present disclosure provides a method for manufacturing a semiconductor structure, which includes:

a substrate is provided;
a bit line structure is formed on the substrate, the bit line structure includes a plurality of bit lines parallel to and spaced apart from each other, sidewalls and a top portion of each of the plurality of bit lines are wrapped with an insulating structure, and a fill channel is formed between the insulating structures on two adjacent bit lines;

the fill channel is filled with a conductive material to form a conductor; the conductor is connected to the transistors on the substrate;
at least one slit is formed on the conductor along a direction perpendicular to a longitudinal direction of the bit line to form a plurality of conductive blocks distributed at intervals on the substrate, each of the plurality of conductive blocks is connected to one of the transistors on the substrate.

According to some embodiments, a second aspect of the present disclosure provides a semiconductor structure, which is manufactured by the method for manufacturing the semiconductor structure of any one of the above-mentioned embodiments.

BRIEF DESCRIPTION OF THE DRAWINGS

In order to describe the technical solution in embodiments of the present disclosure or a conventional art more clearly, the drawings required to be used in descriptions about the embodiments or the conventional art will be simply introduced below. Obviously, the drawings in the following descriptions are only some embodiments of the present disclosure. Those of ordinary skill in the art may further obtain other drawings according to these drawings without creative work.

DETAILED DESCRIPTION OF THE EMBODIMENTS

Figure 1:
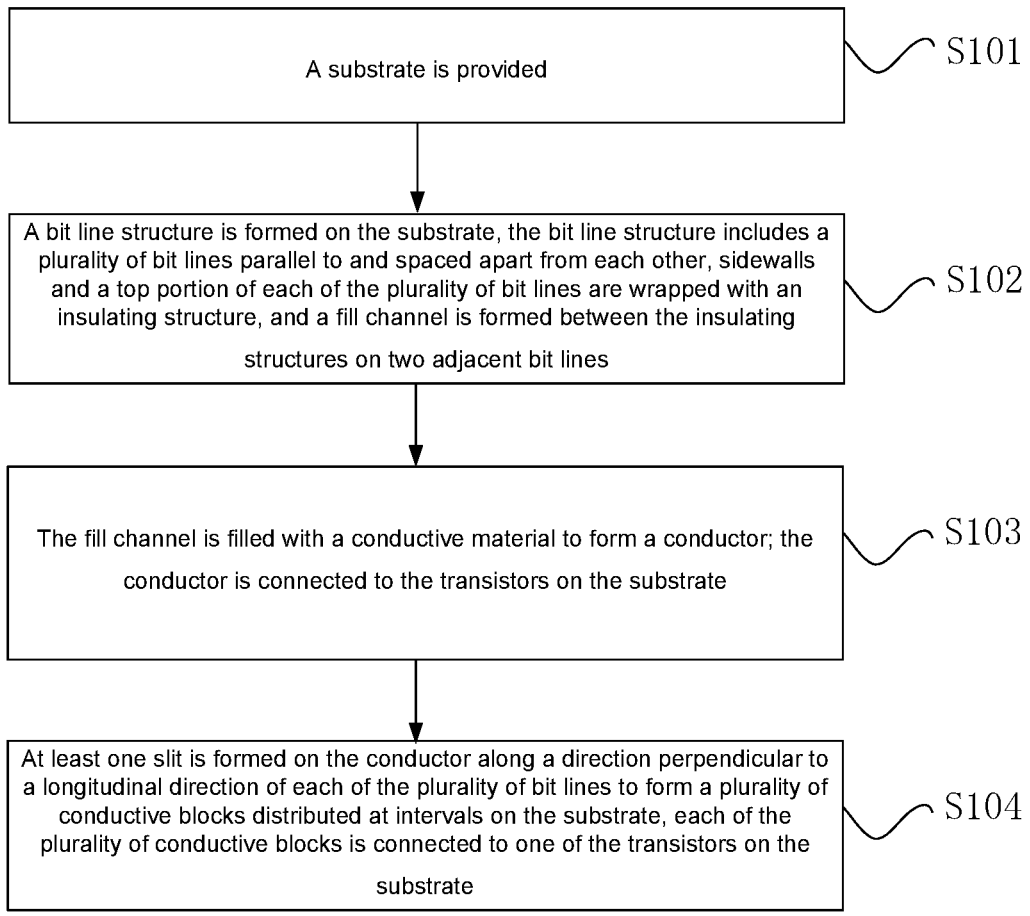
FIG. 1 is a flowchart of a method for manufacturing a semiconductor structure provided by embodiments of the present disclosure.

In order to make the objectives, technical solution, and advantages of embodiments of the present disclosure clearer, the technical solution in the embodiments of the present disclosure will be described clearly and completely in conjunction with the drawings in the embodiments of the present disclosure. Obviously, the described embodiments are a part of, but not all of the embodiments of the present disclosure. Based on the embodiments in the present disclosure, all other embodiments obtained by those of ordinary skill in the art without creative work shall fall within the protection scope of this present disclosure.

A Dynamic Random Access Memory (DRAM) typically includes a capacitor structure and a transistor structure, and the transistor structure is connected to the capacitor structure so as to read data stored in the capacitor structure or write data into the capacitor structure through the transistor structure. In related technologies, the capacitor structure is connected to the transistor in the transistor structure through a plurality of capacitor connection lines on the transistor structure. In the manufacturing process, an insulating structure is firstly formed on a substrate, and the insulating structure has a plurality of holes extending to the substrate, then a conductive material is deposited in each of the plurality of holes so as to form the each of the plurality of capacitor connection lines in the hole.

However, when the conductive material is deposited, the conductive material around the hole is likely to simultaneously move toward a center and has a rapid sealing speed, which is likely to cause a gap to be formed inside the capacitor connection line, and thus affects the performance of the DRAM. For example, the resistance of the capacitor connection line is relatively large, or the gas in the gap easily results in corrosion, oxidation, and the like of the capacitor connection line.

The embodiments provide a method for manufacturing a semiconductor structure and a semiconductor structure. A plurality of bit lines that are parallel to and spaced apart from each other are firstly formed on a substrate, and the bit line is wrapped with an insulating structure thereon, so that a fill channel is formed between the insulating structures on two adjacent bit lines. Afterwards, a conductor is formed in the fill channel and is divided so as to form a plurality of conductive blocks that are configured to connect a capacitor structure. Compared with the technical solutions of firstly forming the insulating structure that has the plurality of holes on the substrate, and forming the capacitor connection line in the hole, when the conductor is formed in the fill channel, the conductive material moves inwardly from two opposite sidewalls of the fill channel, the sealing speed of the conductive material is relative slow, which reduces a gap volume formed within the conductor, thereby improving the performance of the semiconductor structure.

The embodiment provides a method for manufacturing a semiconductor structure. The semiconductor structure can be the DRAM. Of course, the semiconductor structure can also be another structure.

As shown in FIG. 1, the method for manufacturing the semiconductor structure provided by the embodiment includes:

At S101, a substrate is provided.

Figure 2:
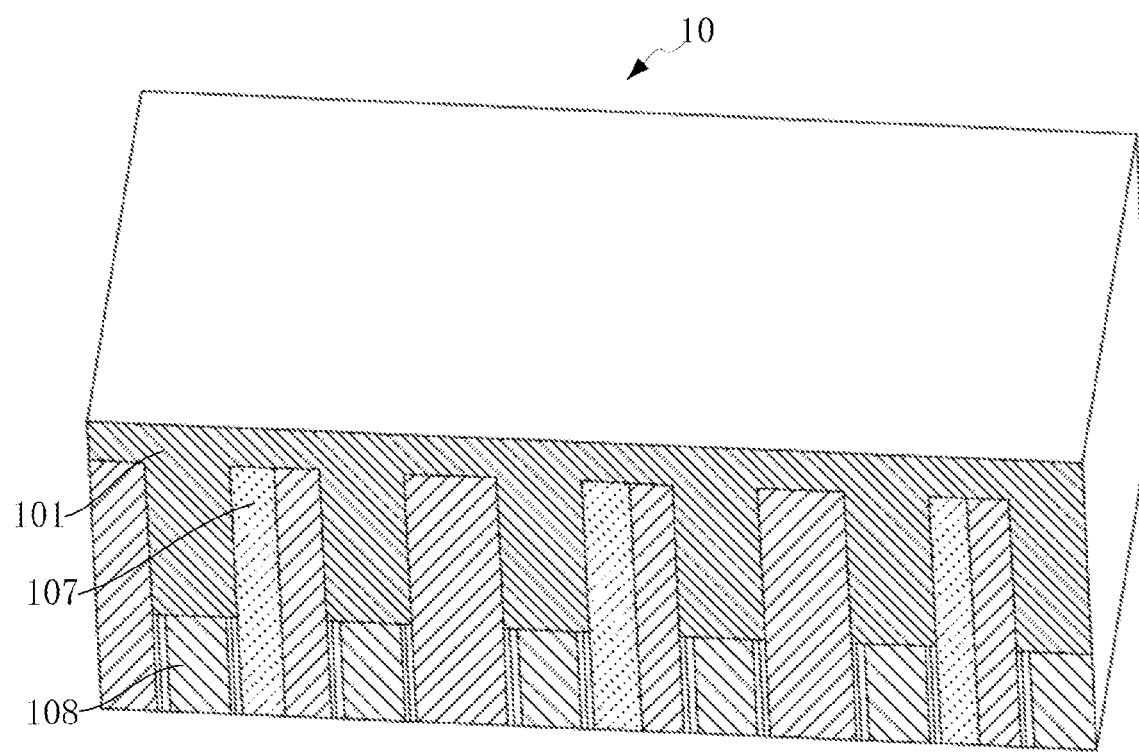
FIG. 2 is a schematic structural diagram after a substrate is formed in a method for manufacturing a semiconductor structure provided by embodiments of the present disclosure.
Figure 3:
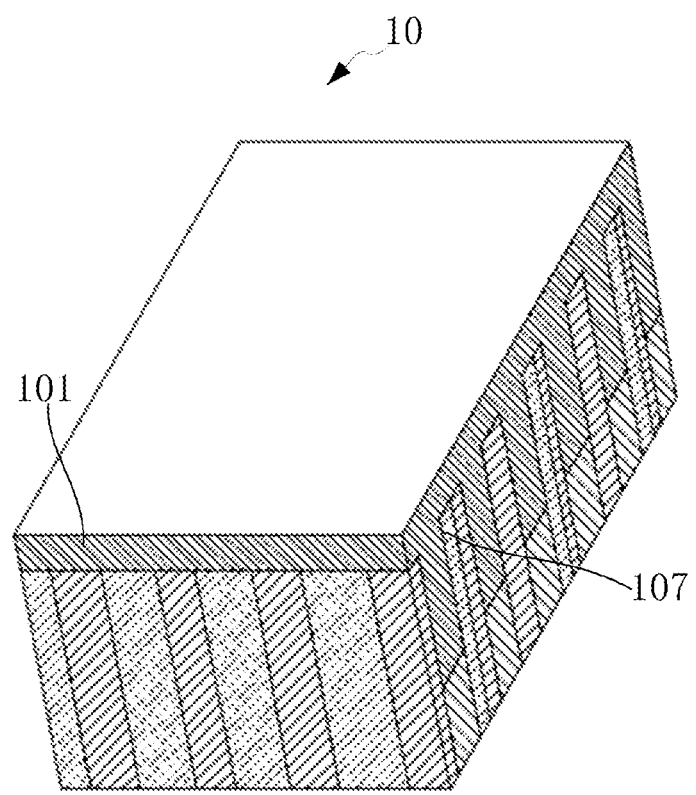
FIG. 3 is a schematic structural diagram after a substrate is formed in a method for manufacturing a semiconductor structure provided by embodiments of the present disclosure.
Figure 4:
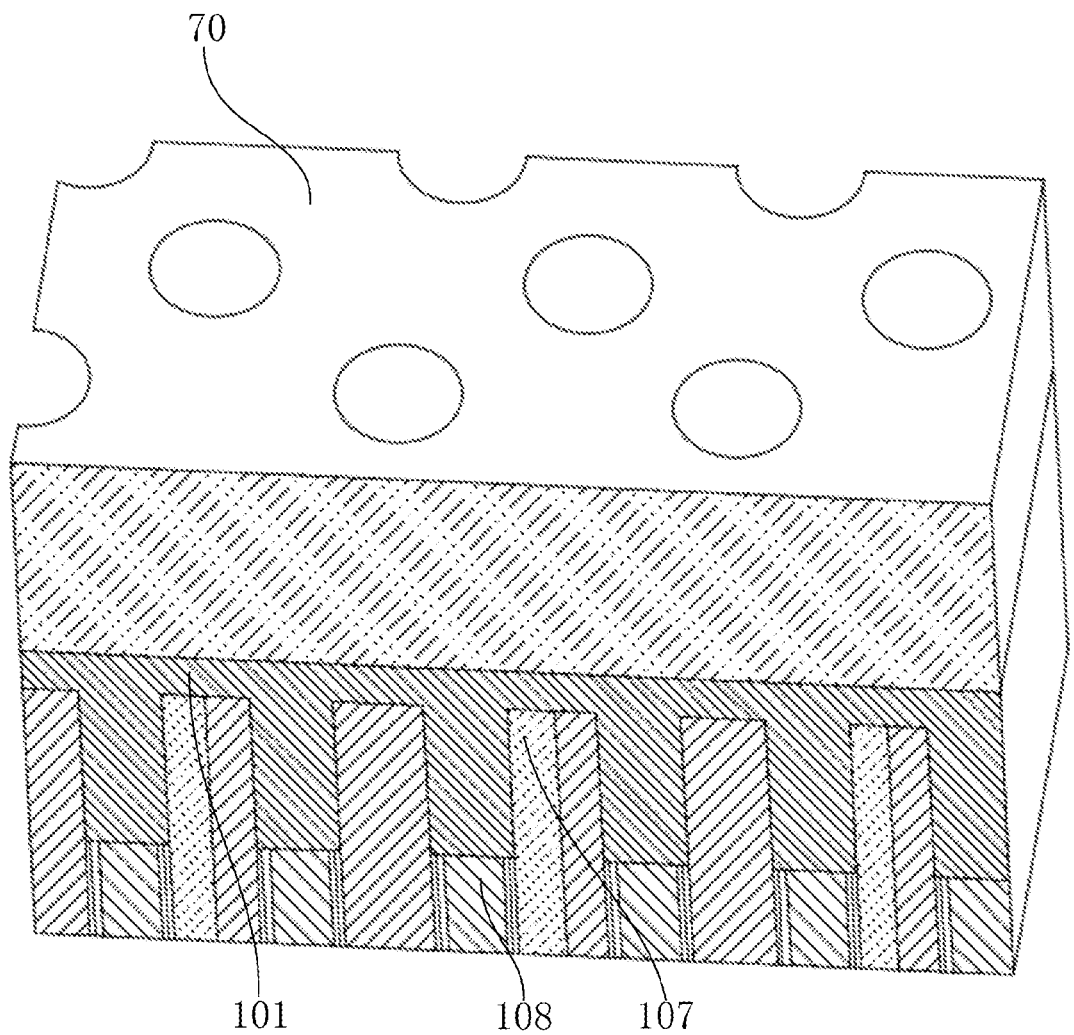
FIG. 4 is a schematic structural diagram after a mask layer is formed in a method for manufacturing a semiconductor structure provided by embodiments of the present disclosure.
Figure 5:
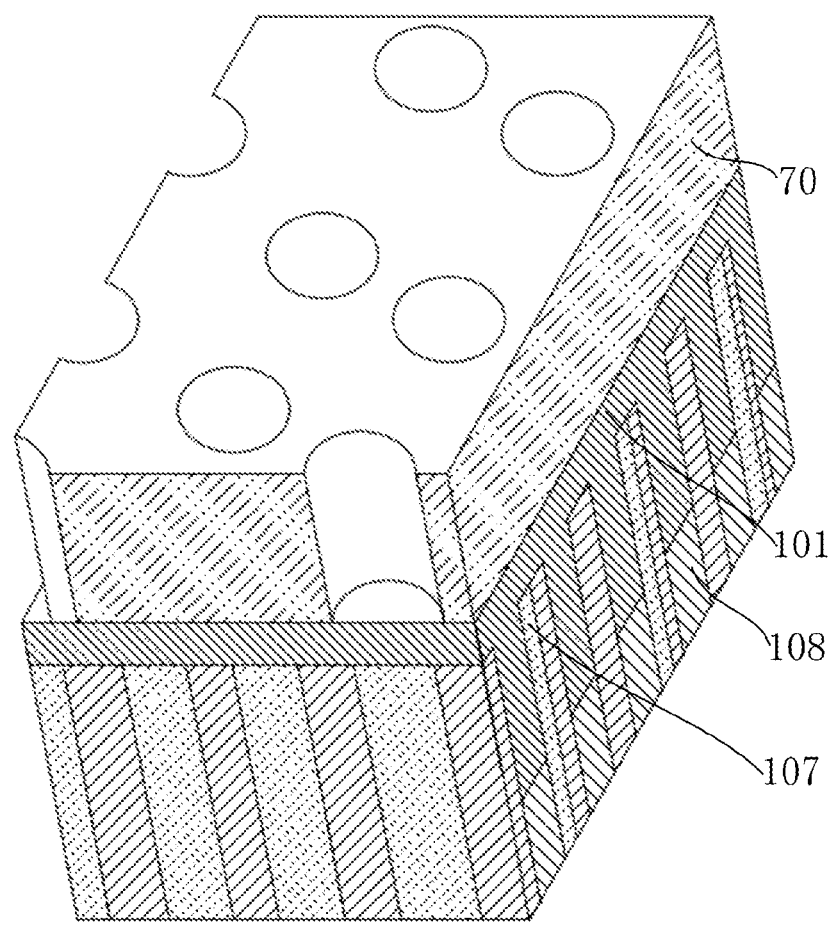
FIG. 5 is a schematic structural diagram after a mask layer is formed in a method for manufacturing a semiconductor structure provided by embodiments of the present disclosure.
Figure 6:
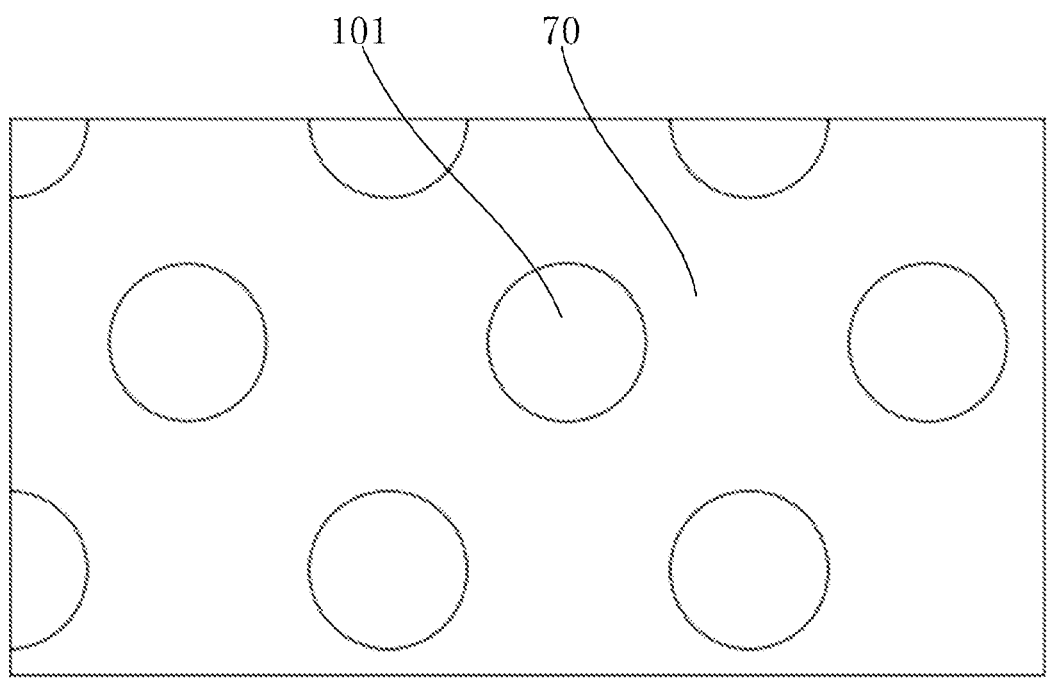
FIG. 6 is a top view of FIG. 4.
Figure 7:
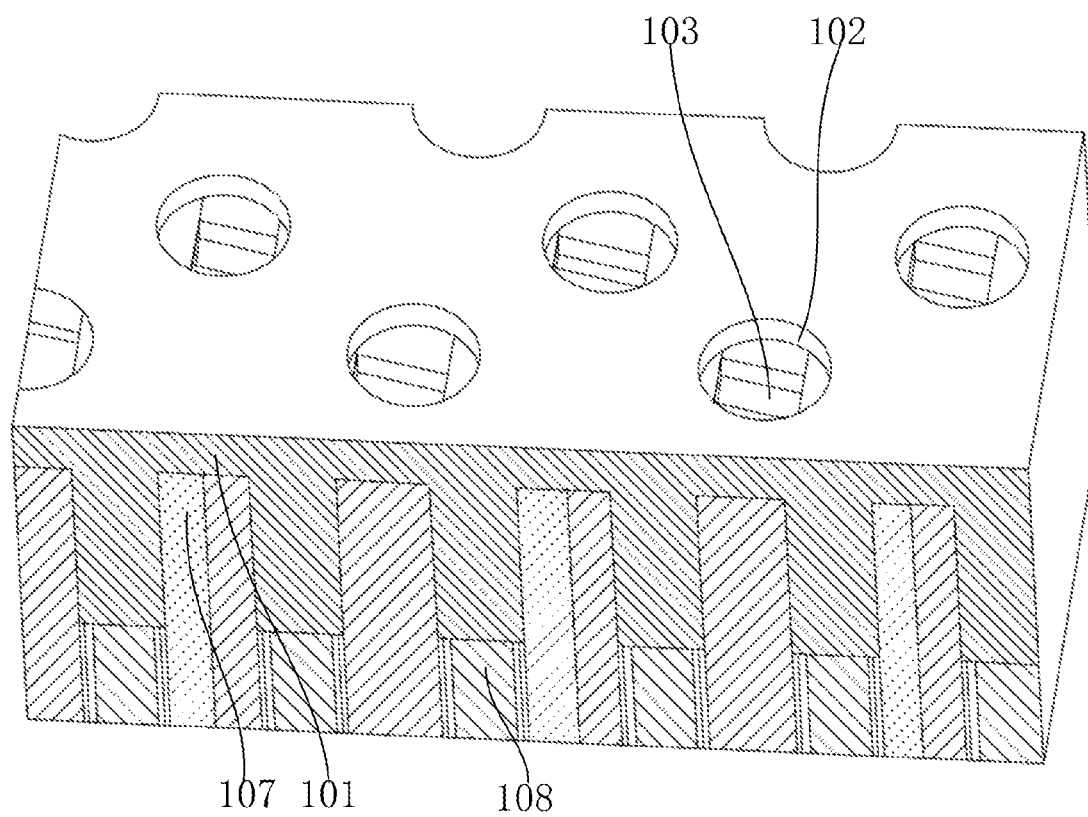
FIG. 7 is a schematic structural diagram after at least one bit line contact hole is formed in a method for manufacturing a semiconductor structure provided by embodiments of the present disclosure.
Figure 8:
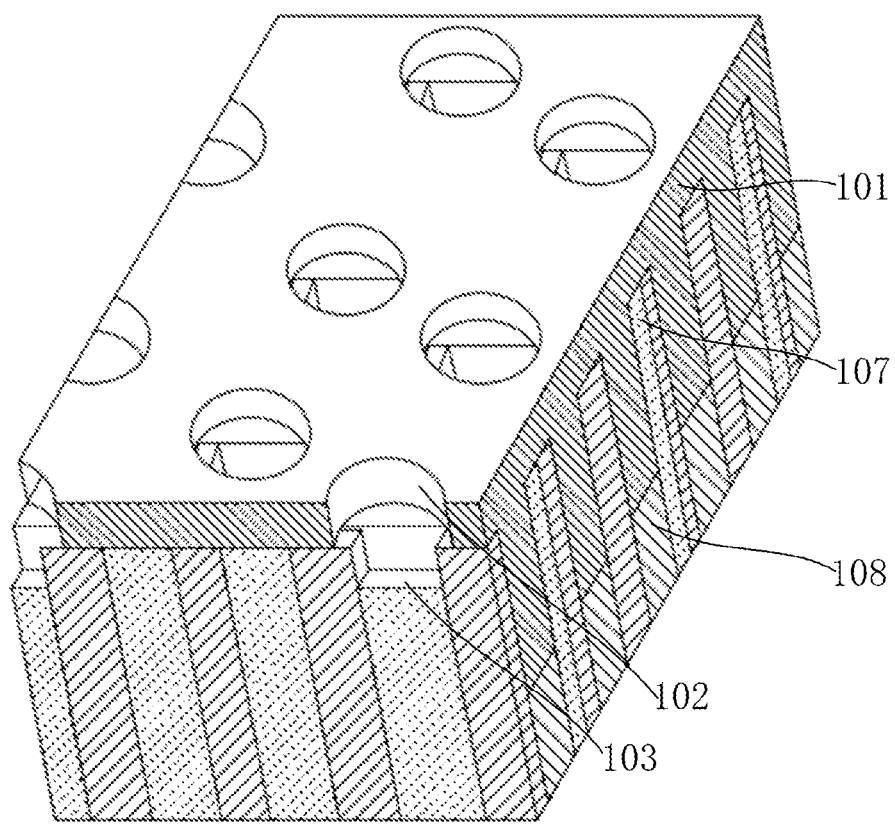
FIG. 8 is a schematic structural diagram after at least one bit line contact hole is formed in a method for manufacturing a semiconductor structure provided by embodiments of the present disclosure.
Figure 9:
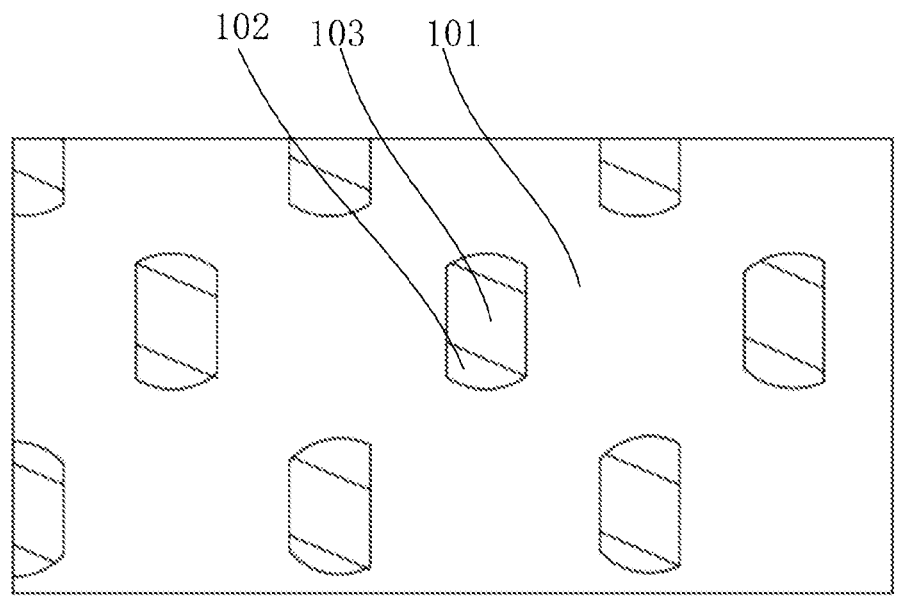
FIG. 9 is a top view of FIG. 7.

Referring to FIG. 2 and FIG. 3, in the embodiment, a material of the substrate 10 can include silicon, germanium, or the like.

In an embodiment that the semiconductor structure is the DRAM, there are transistors (not shown) and word lines 108 in the substrate 10. The transistor is configured to be connected to a capacitor structure so as to read data from the capacitor structure or write data into the capacitor structure through the transistor. Further, there is an insulating filler body located at a side of the word line 108 that faces away from the substrate 10 in the substrate 10.

After forming the substrate 10, the method for manufacturing the semiconductor structure provided by the embodiment further includes:.

At S102, a bit line structure is formed on the substrate, the bit line structure includes a plurality of bit lines parallel to and spaced apart from each other, sidewalls and a top portion of each of the plurality of bit lines are wrapped with an insulating structure, and a fill channel is formed between the insulating structures on two adjacent bit lines.

With continued reference to FIG. 2 and FIG. 3, in some embodiments, before a bit line structure 20 is formed, the method for manufacturing the semiconductor structure includes: an insulating layer 101 is formed on the substrate 10, and the insulating layer 101 covers the substrate 10. In some embodiments, a material of the insulating layer 101 includes silicon nitride, silicon oxide, or the like.

Referring to FIG. 4 to FIG. 9, after the insulating layer 101 is formed, at least one bit line contact hole 102 is formed in the insulating layer 101, and each of the at least one bit line contact hole 102 extends to a bit line connection structure 103 on the substrate 10. Exemplarily, a portion of the insulating layer 101 is removed by etching to form the at least one bit line contact hole 102 in the insulating layer 101, and each of the at least one bit line contact hole 102 extends to the bit line connection structure 103 in the substrate 10 by controlling an etching depth. Specifically, a mask layer 70 is formed on the insulating layer 101, and the mask layer 70 has at least one hole. The insulating layer 101 and the substrate 10 are etched by using the mask layer 70 as a mask to form the at least one bit line contact hole 102.

Figure 10:
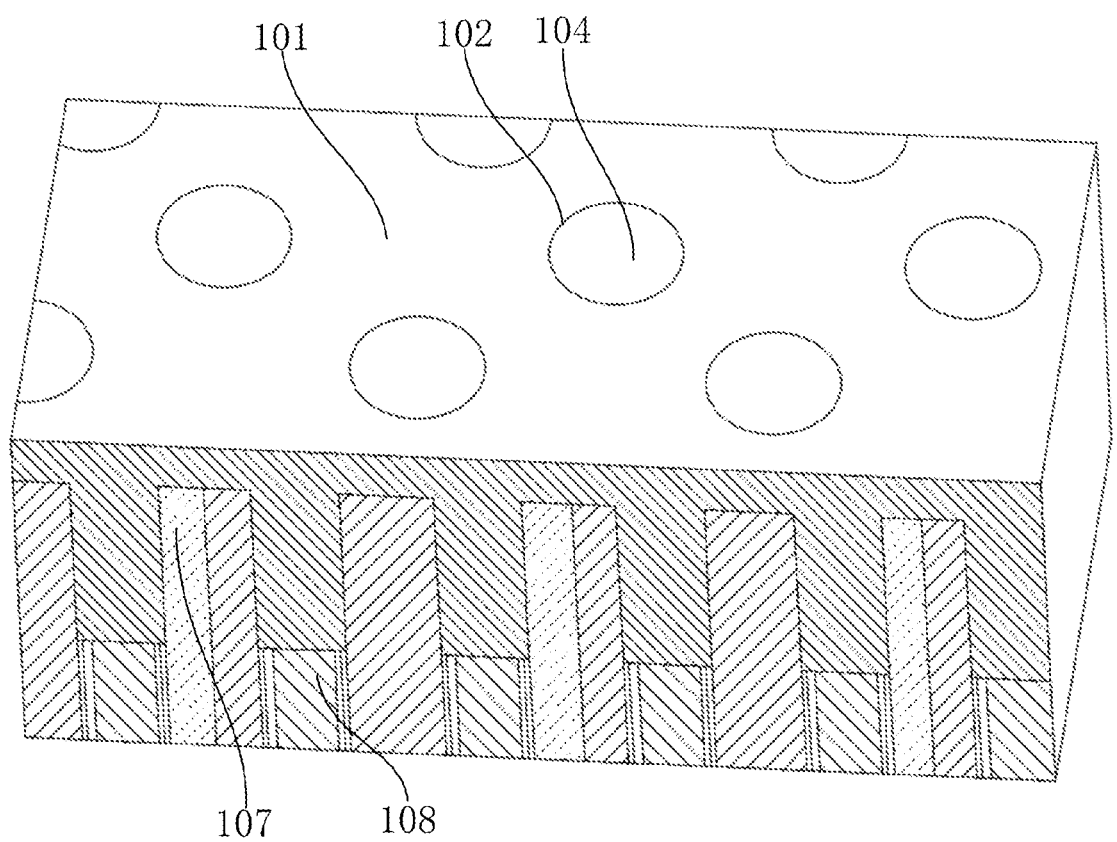
FIG. 10 is a schematic structural diagram after at least one bit line contact plug is formed in a method for manufacturing a semiconductor structure provided by embodiments of the present disclosure.
Figure 11:
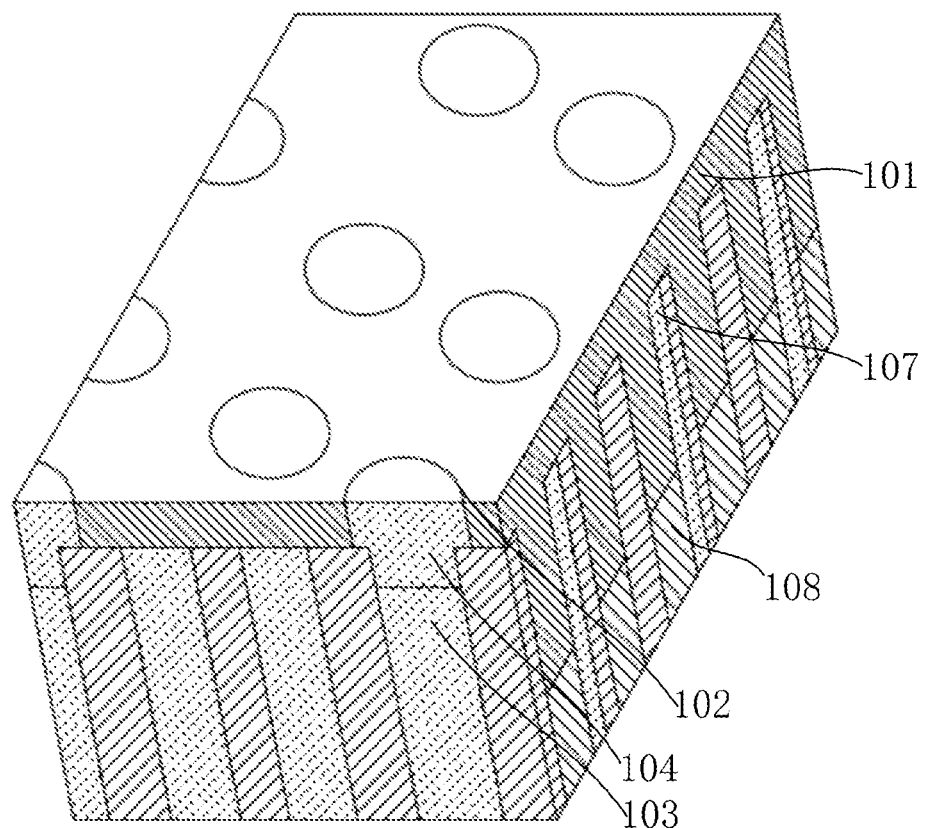
FIG. 11 is a schematic structural diagram after at least one bit line contact plug is formed in a method for manufacturing a semiconductor structure provided by embodiments of the present disclosure.
Figure 12:
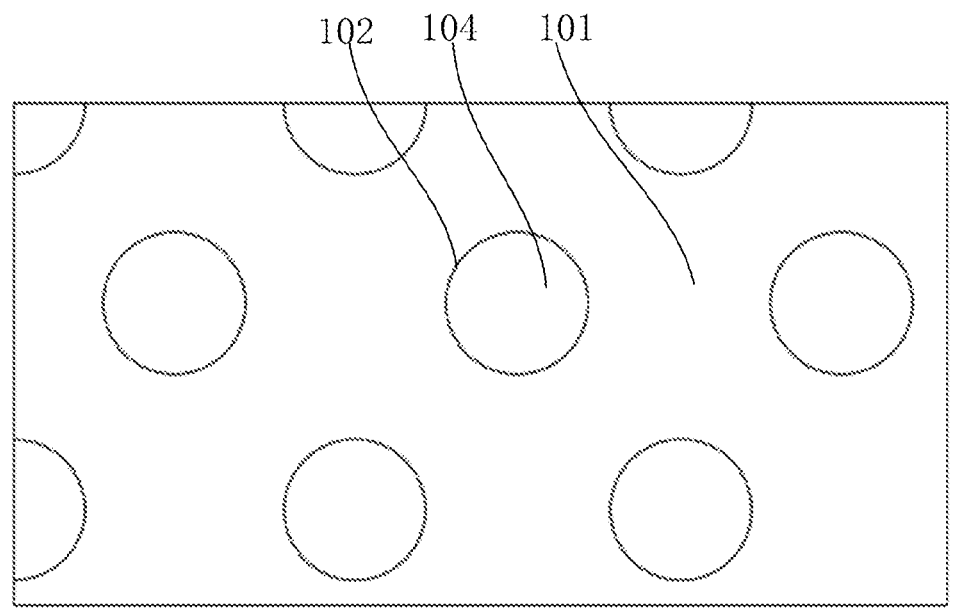
FIG. 12 is a top view of FIG. 10.

Referring to FIG. 10 to FIG. 12, after the bit line contact hole 102 is formed, the method further includes: a bit line contact plug 104 is formed in each of the at least one bit line contact hole 102. Exemplarily, a material of the bit line contact plug 104 includes a conductive material such as polysilicon.

In the above-mentioned implementation, when a bit line 204 is formed, each of the plurality of bit lines 204 covers at least a portion of the bit line contact plug 104 so that each of the plurality of bit lines 204 can be connected to the bit line connection structure 103 in the substrate 10 through the bit line contact plug 104.

Referring to FIG. 13 to FIG. 19, in the embodiment, forming a bit line structure 20 on the substrate 10 includes: a bit line layer 240 and an insulating capping layer 210 are subsequently formed and stacked on the substrate; afterwards, a portion of the insulating capping layer 210 and a portion of the bit line layer 240 are removed so as to form the plurality of bit lines 204 that are parallel to and spaced apart from each other, each of the plurality of bit lines 204 has an insulator 201 on a side that faces away from the substrate 10; afterwards, an insulating sidewall 205 is formed on side surfaces of each of the plurality of bit lines 204 and side surfaces of the insulator 201, and thus the insulating sidewall 205 and the insulator 201 constitute the insulating structure 206.

By the settings described above, the insulating structure 206 that wraps each of the plurality of bit lines 204 can realize protection to each of the plurality of bit lines 204, thereby preventing each of the plurality of bit lines 204 from contacting with the outer air so as to prevent each of the plurality of bit lines 204 from being oxidized or corroded.

Exemplarily, a material of the bit line layer 240 includes a metal such as titanium, tungsten, or the like. Of course, the material of the bit line layer can also include a non-metallic conductive material such as polysilicon. A material of the insulating capping layer 210 can include silicon nitride, silicon oxide, or the like.

It is noteworthy that the plurality of bit lines 204 are provided in parallel and spaced apart from one another on the substrate 10, each insulating structure 206 cover one of the plurality of bit lines 204, the insulating structures 206 on two adjacent bit lines 204 define a fill channel 207.

Figure 13:
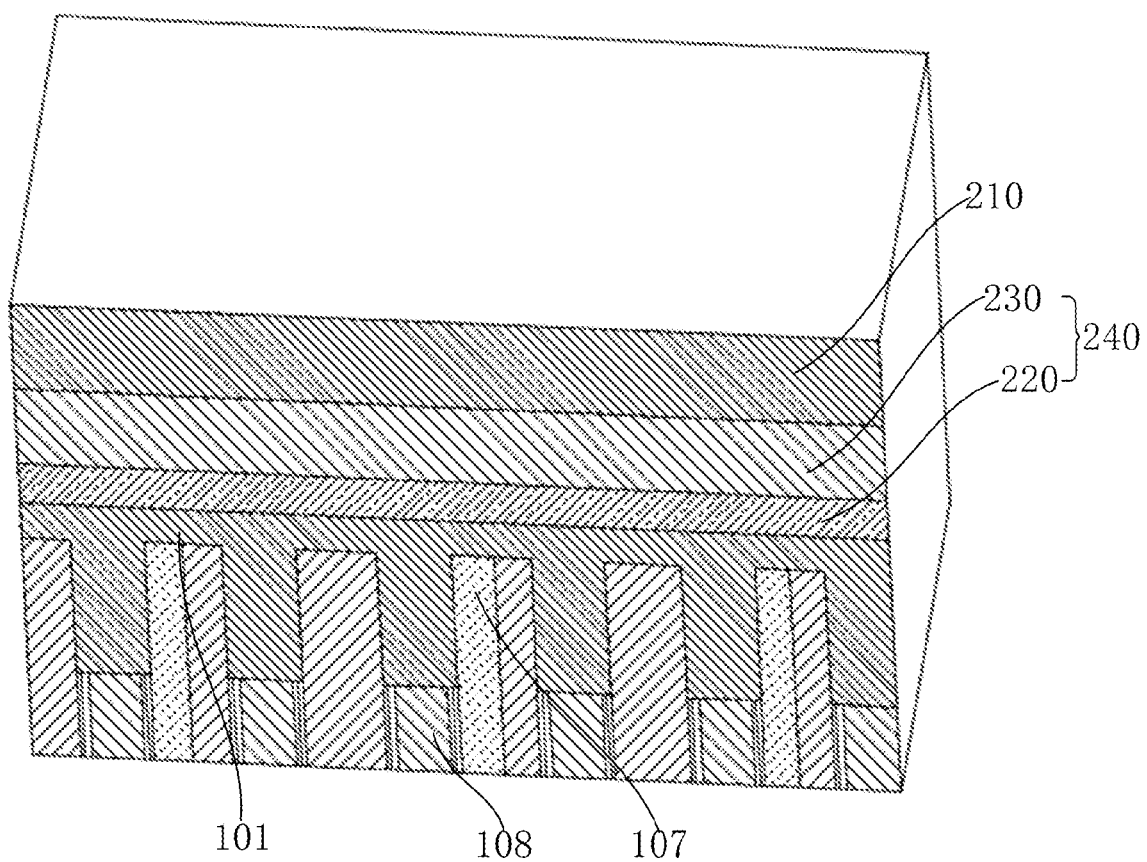
FIG. 13 is a schematic structural diagram after an insulating capping layer is formed in a method for manufacturing a semiconductor structure provided by embodiments of the present disclosure.

With continued reference to FIG. 13 and FIG. 14, in some embodiments, forming the bit line layer 240 includes that a first bit line layer 220 and a second bit line layer 230 are subsequently formed and stacked on the substrate 10, the insulating capping layer 210 is formed on the second bit line layer 230, the first bit line layer 220, the second bit line layer 230, and the insulating capping layer 210 are etched, and thus the plurality of bit lines 204 are formed; that is, in the etching process, a portion of the first bit line layer 220 is removed to form a plurality of first bit lines 202, a portion of the second bit line layer 230 is removed to form a plurality of second bit lines 203, and one of the plurality of first bit lines 202 and one of the plurality of the second bit lines 203 constitute one of the plurality of the bit lines 204. Exemplarily, a material of the first bit line layer 220 includes silicon nitride, etc., and a material of the second bit line layer 230 includes tungsten, etc.

In the above-mentioned implementation, forming the insulating sidewall 205 at the side surfaces of the bit line 204 and side surfaces of the insulator 201 includes: a first insulating sidewall, a second insulating sidewall, and a third insulating sidewall are subsequently formed on the side surfaces of each of the plurality of bit lines 204 and side surfaces of the insulator 201, a material of the first insulating sidewall is the same as that of the third insulating sidewall, and a material of the second insulating sidewall is different from that of the first insulating sidewall. As such, a capacitor can be prevented from being formed between the bit line 204 and another conductive structure, and at the same time a leakage can also be avoided between the bit line 204 and another conductive structure, thereby improving the performance of the semiconductor structure.

Exemplarily, both the first insulating sidewall and the third insulating sidewall are silicon nitride sidewalls, and the second insulating sidewall is a silicon oxide sidewall. Further, the first insulating sidewall and the third insulating sidewall can wrap the second insulating sidewall, and a material of the insulating capping layer can also be silicon nitride, so that the insulator 201 at the side of the bit line 204 that faces away from the substrate 10, the first insulating sidewall, and the third insulating sidewall may form an integral structure to improve the performance of the semiconductor structure.

Figure 14:
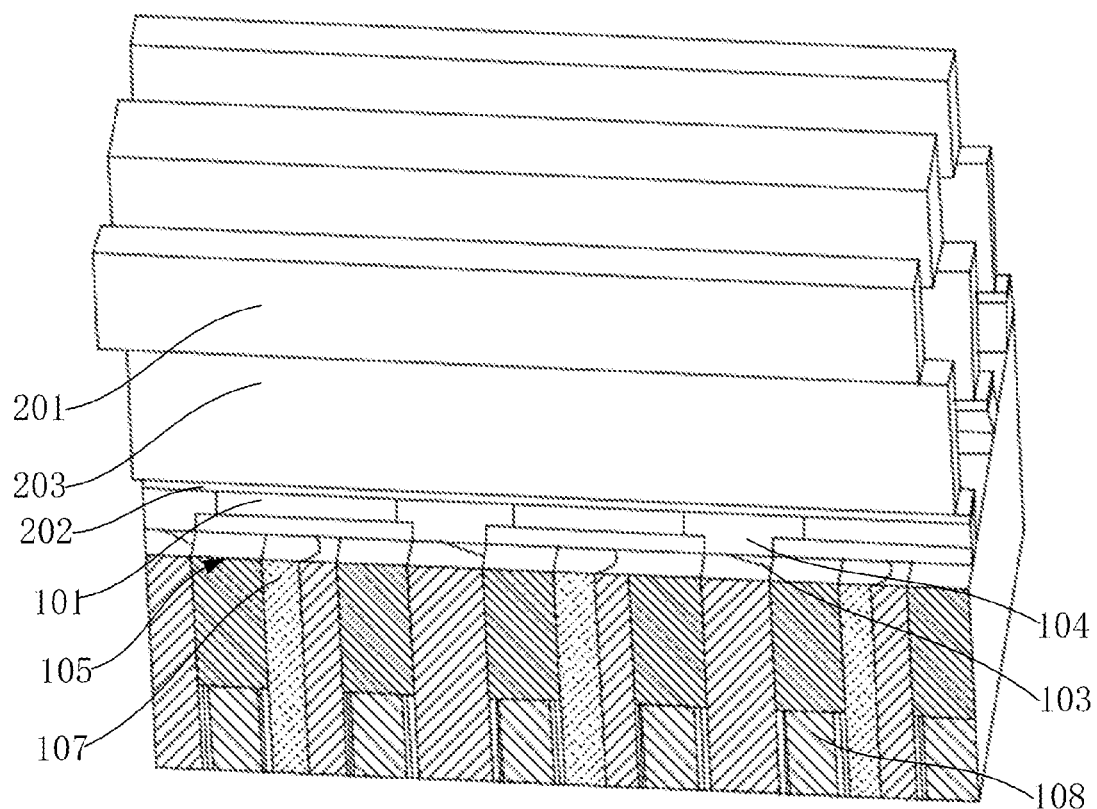
FIG. 14 is a schematic structural diagram after a bit line is formed in a method for manufacturing a semiconductor structure provided by embodiments of the present disclosure.
Figure 15:
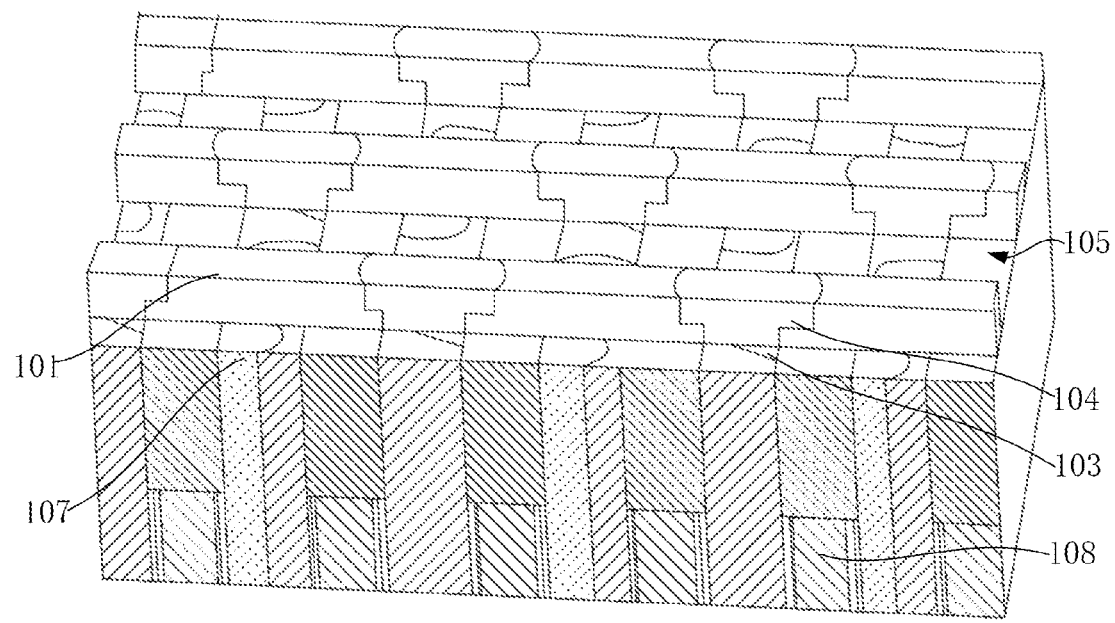
FIG. 15 is a schematic structural diagram after at least one groove is formed in a method for manufacturing a semiconductor structure provided by embodiments of the present disclosure.
Figure 16:
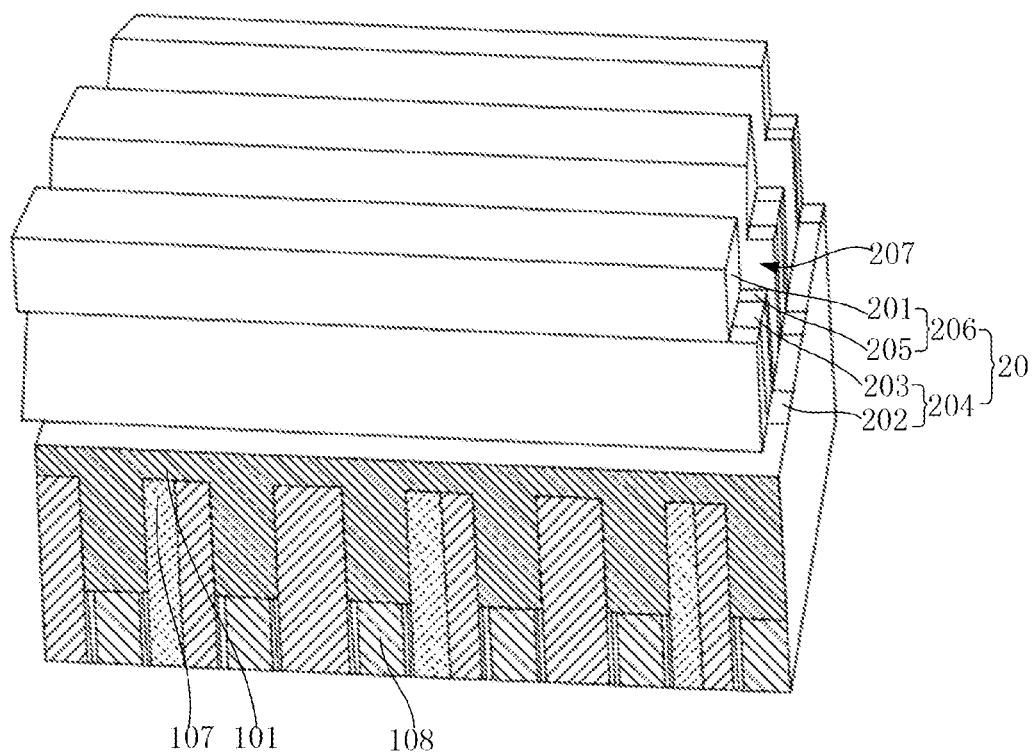
FIG. 16 is a schematic structural diagram after an insulating sidewall is formed in a method for manufacturing a semiconductor structure provided by embodiments of the present disclosure.
Figure 17:
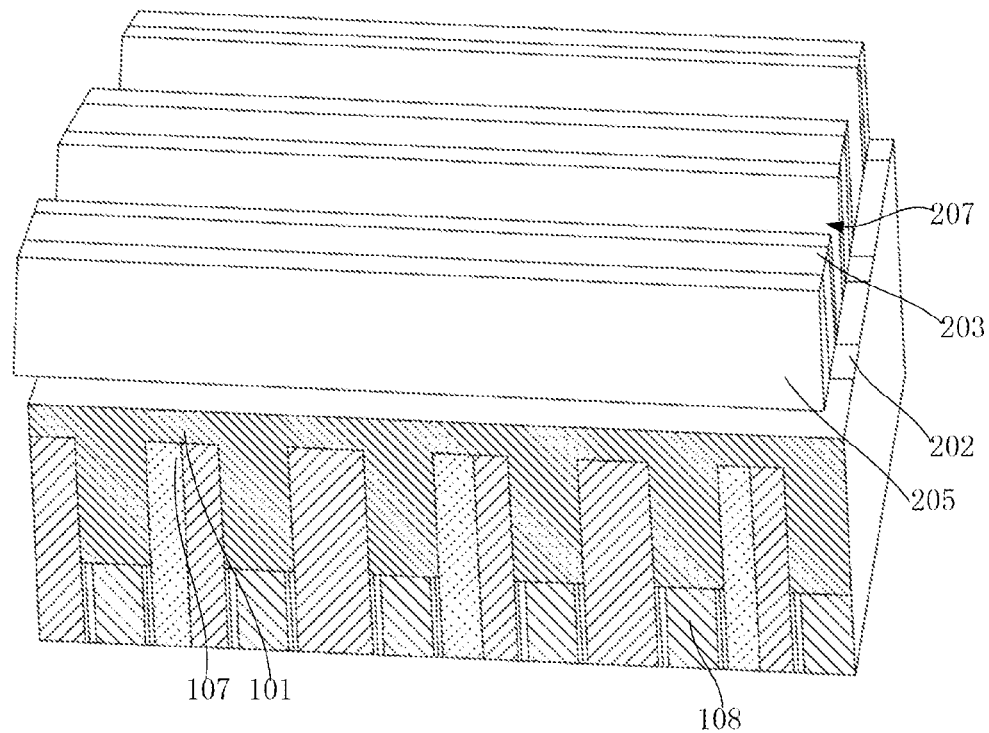
FIG. 17 is a schematic structural diagram of a lower portion of an insulator in FIG. 16.
Figure 18:
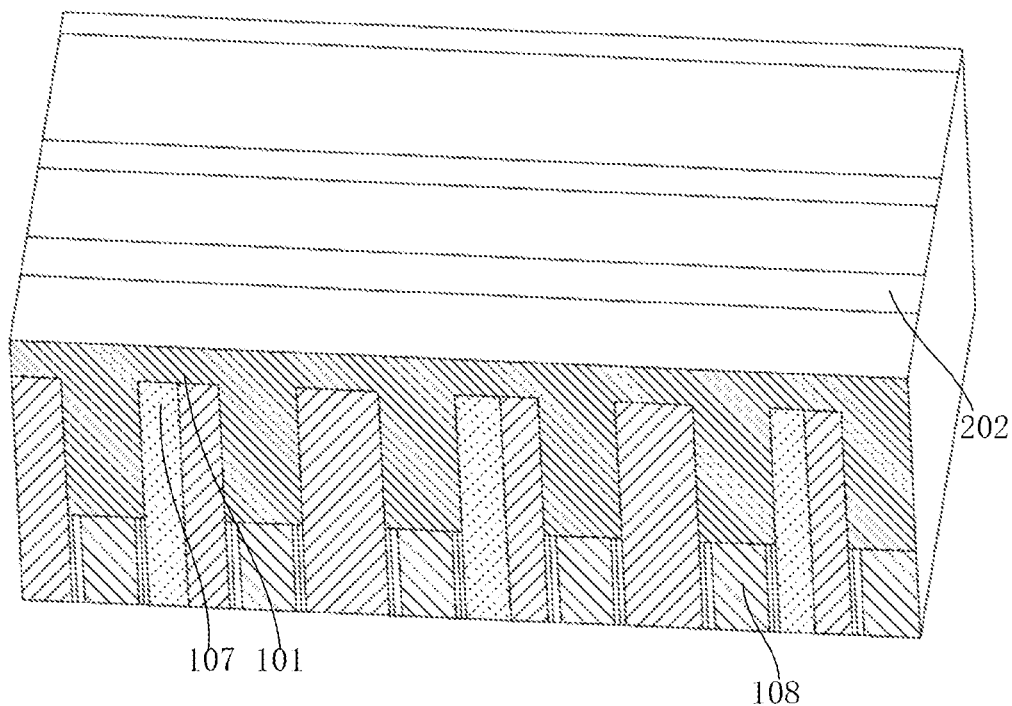
FIG. 18 is a schematic structural diagram of a lower portion of a second bit line in FIG. 16.
Figure 19:
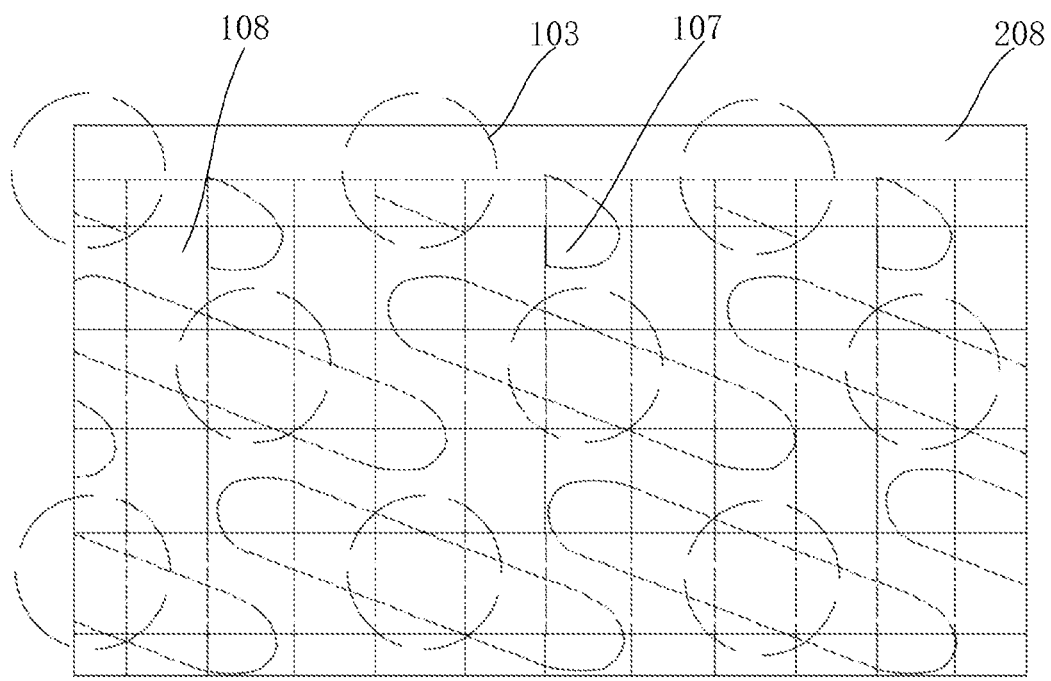
FIG. 19 is a top view after a bit line structure is formed in a method for manufacturing a semiconductor structure provided by embodiments of the present disclosure.
Figure 20:
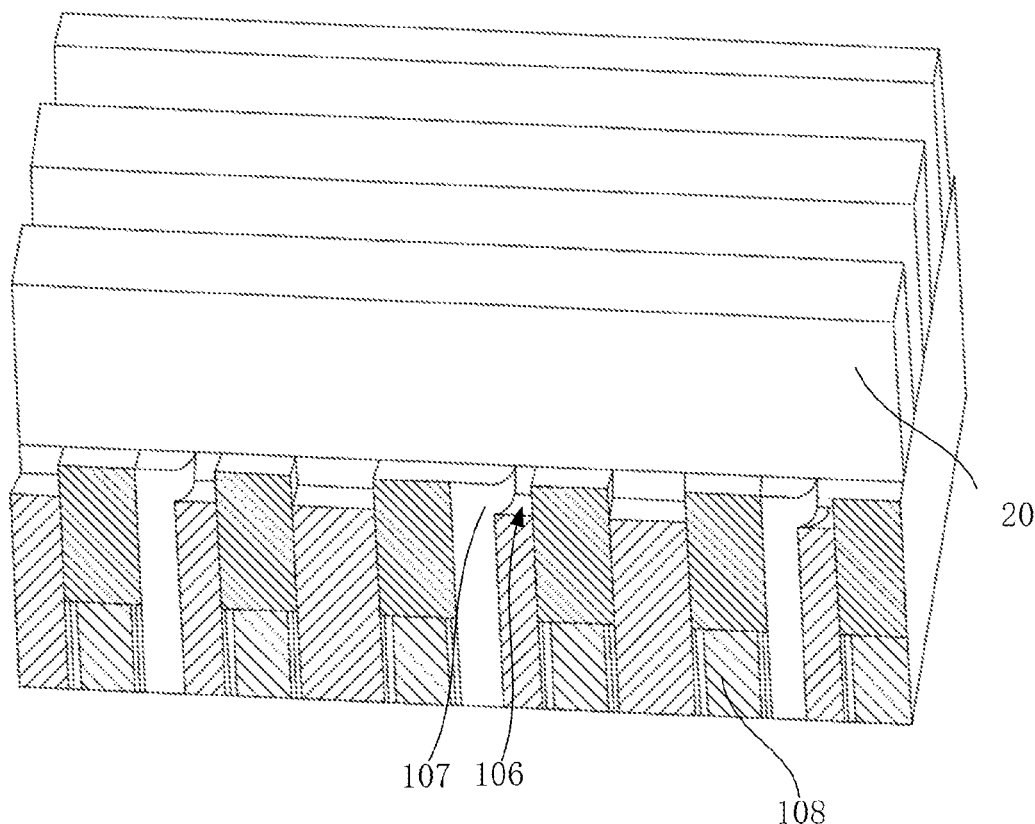
FIG. 20 is a schematic structural diagram after at least one capacitor connection hole is formed in a method for manufacturing a semiconductor structure provided by embodiments of the present disclosure.
Figure 21:
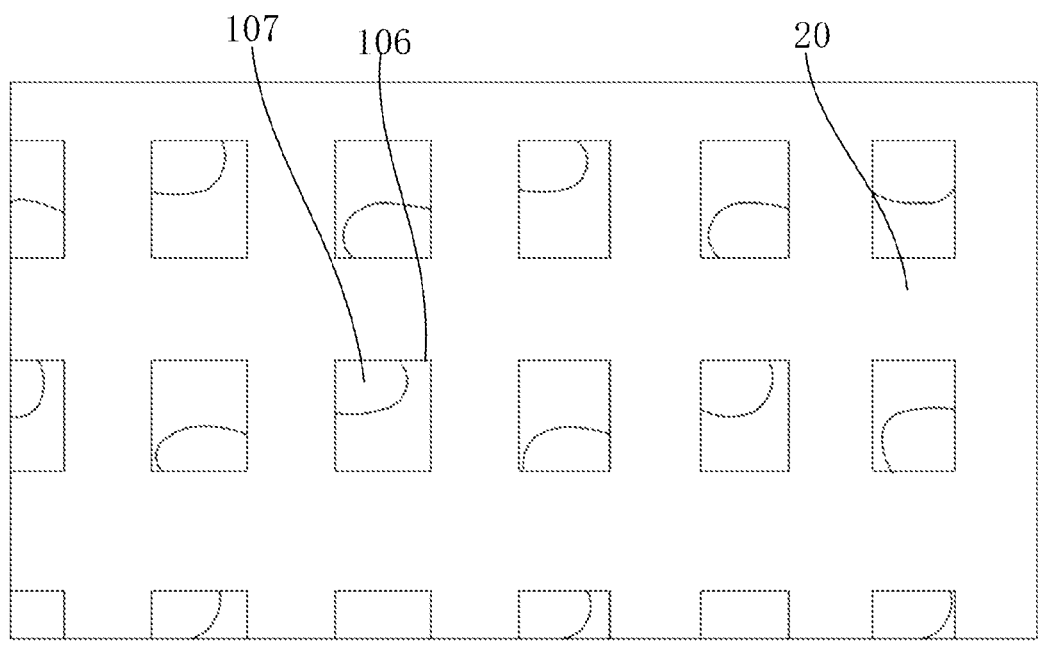
FIG. 21 is a top view of FIG. 20.
Figure 22:
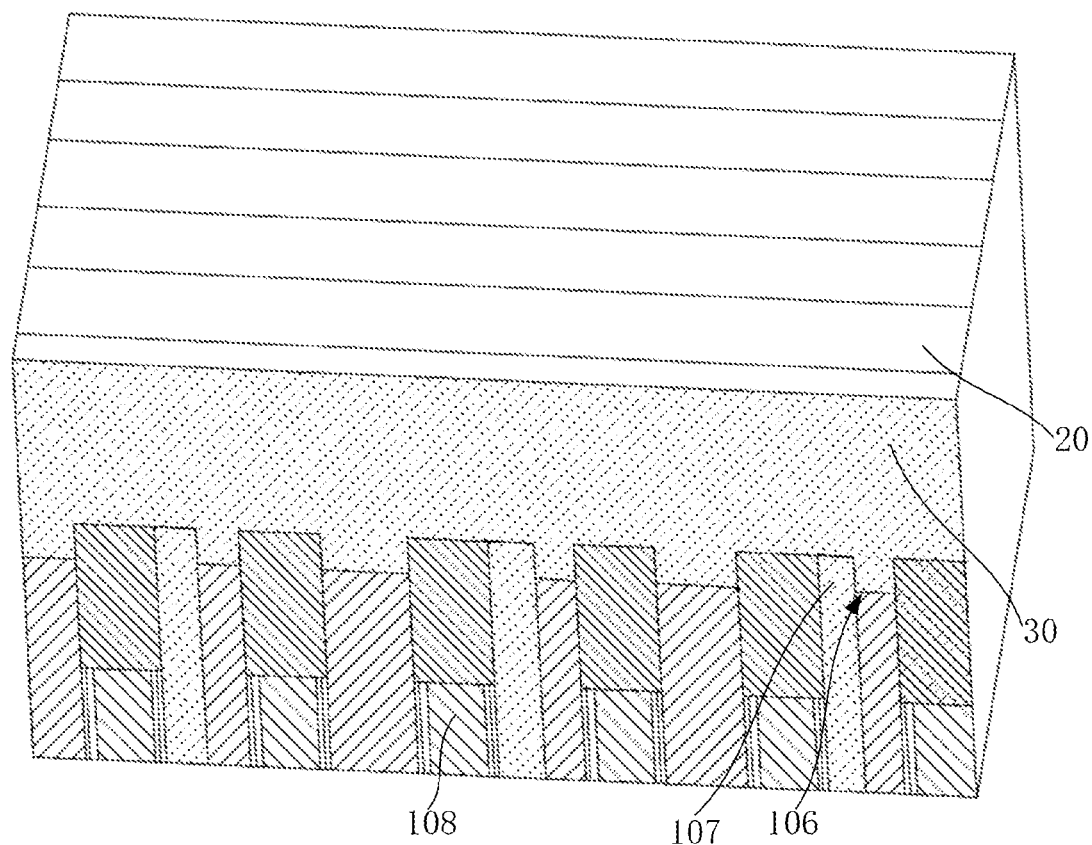
FIG. 22 is a schematic structural diagram after a conductor is formed in a method for manufacturing a semiconductor structure provided by embodiments of the present disclosure.
Figure 23:
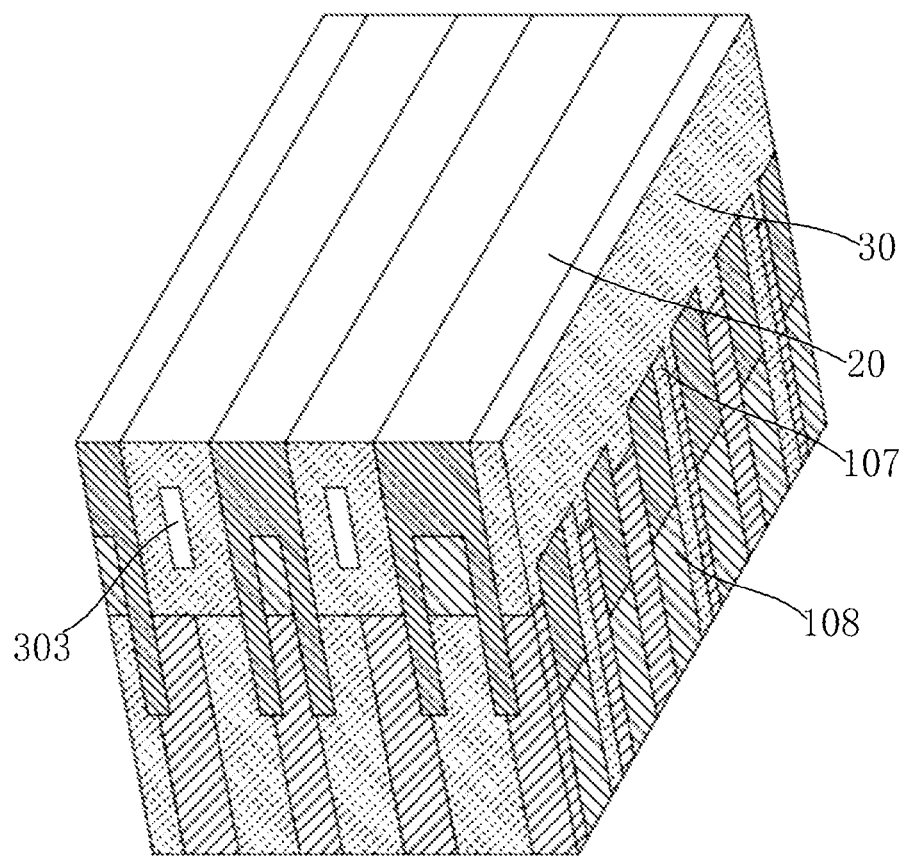
FIG. 23 is a schematic structural diagram after a conductor is formed in a method for manufacturing a semiconductor structure provided by embodiments of the present disclosure.

With continued reference to FIG. 14 and FIG. 15, in the embodiment, after the portion of the insulating capping layer 210 and the portion of the bit line layer 240 are removed to form the plurality of bit lines 204 in parallel with and spaced apart from each other, the method further includes: the insulating layer 101 between every two adjacent bit lines 204 is removed to form at least one groove 105.

Exemplarily, the insulating layer 101 between every two adjacent bit lines 204 can be removed by etching to form the at least one groove 105. Reasonably setting the etching depth can allow a groove bottom of each of the at least one groove 105 to be flush with an end of each of the at least one bit line contact hole 102 that is toward the substrate 10; that is, the groove bottom of each of the at least one groove 105 is flush with the bit line connection structure 103.

Further, when the insulating sidewall 205 is formed on sides surface of each of the plurality of bit lines 204 that is perpendicular to the substrate 10, a portion of the insulating sidewall 205 is filled within the groove 105. Exemplarily, in the implementation that the bit line 204 includes the first bit line 202 and the second bit line 203, a top surface of the insulating sidewall 205 that is filled in each of the at least one groove 105 (an upper surface as oriented in FIG. 16) can be flush with a top surface of the first bit line 202.

In the method for manufacturing the semiconductor structure provided by the embodiment, after forming the at least one bit line structure 20, the following step is also included.

At S103, the fill channel is filled with a conductive material to form a conductor; the conductor is connected to the transistors on the substrate.

Referring to FIG. 20 to FIG. 23, exemplarily, a material of the conductor 30 can include polysilicon, etc. The conductive material can be filled in the fill channel 207 by depositing to form the conductor 30; in the depositing process, the conductive material moves inwardly from two opposite sidewalls of the fill channel 207, the sealing speed is relative slow, which reduces or eliminates a gap 303 in the conductor 30.

In order to achieve connection between the conductor 30 and the transistors in the substrate 10, before the conductor 30 is formed and after the insulating sidewall 205 is formed, at least one capacitor connection hole 106 is formed on the insulating sidewall 205 that corresponds to each of the at least one groove 105, and each of the at least one capacitor connection hole 106 extends to a capacitor contact structure 107 in the substrate 10.

Exemplarily, a portion of the insulating sidewall 205 corresponding to the groove 105 can be removed by etching so that each of the at least one capacitor connection hole 106 extends to the capacitor structure in the substrate 10.

Further, when the conductive material is filled within the fill channel 207 to form the conductor 30, a portion of the conductor 30 is filled in each of the at least one capacitor connection hole 106 so as to be bonded to the capacitor contact structure 107.

In the method for manufacturing the semiconductor structure provided by the embodiment, after forming the conductor 30, the following step is also included.

At S104, at least one slit is formed on the conductor along a direction perpendicular to a longitudinal direction of each of the plurality of bit lines to form a plurality of conductive blocks distributed at intervals on the substrate, each of the plurality of conductive blocks is connected to one of the transistors on the substrate.

Figure 24:
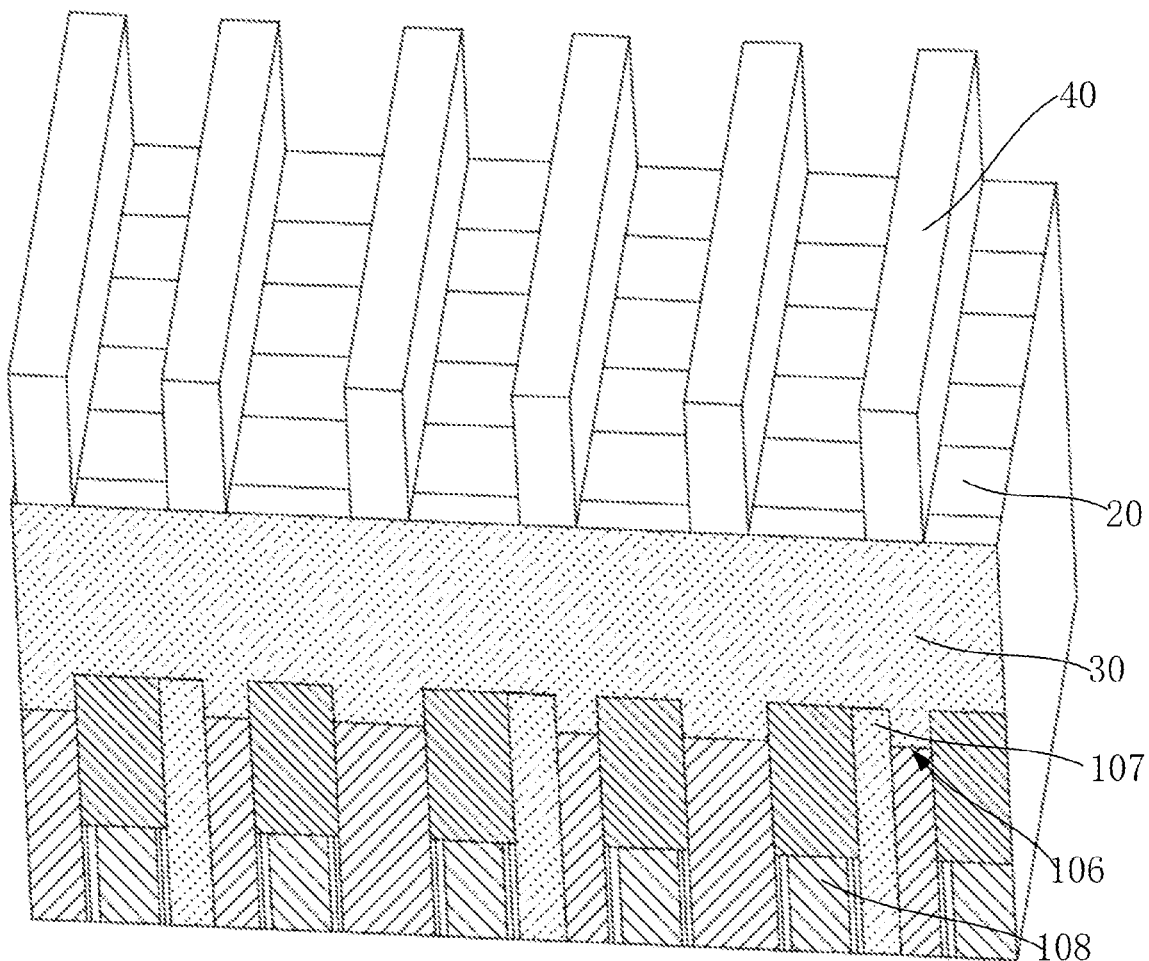
FIG. 24 is a schematic structural diagram after a lithography layer is formed in a method for manufacturing a semiconductor structure provided by embodiments of the present disclosure.
Figure 25:
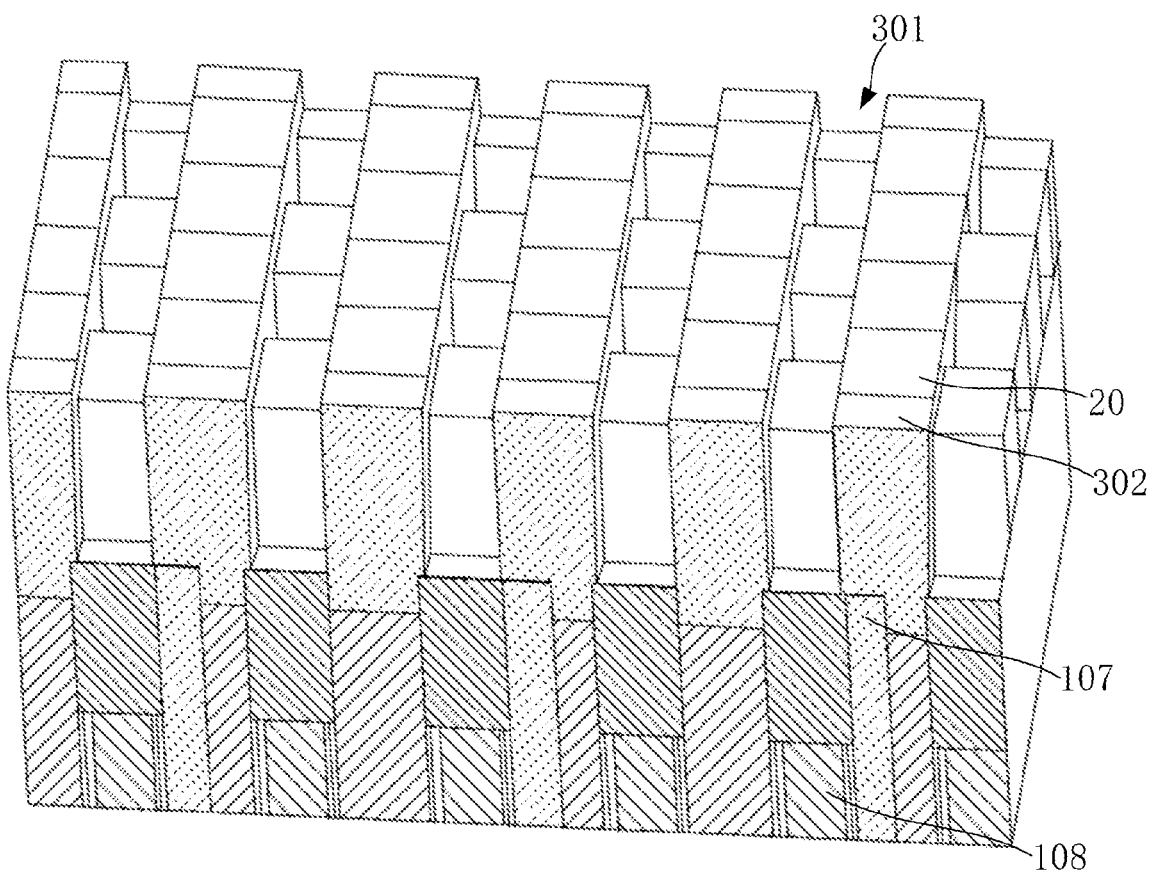
FIG. 25 is a schematic structural diagram after at least one slit is formed in a method for manufacturing a semiconductor structure provided by embodiments of the present disclosure.
Figure 26:
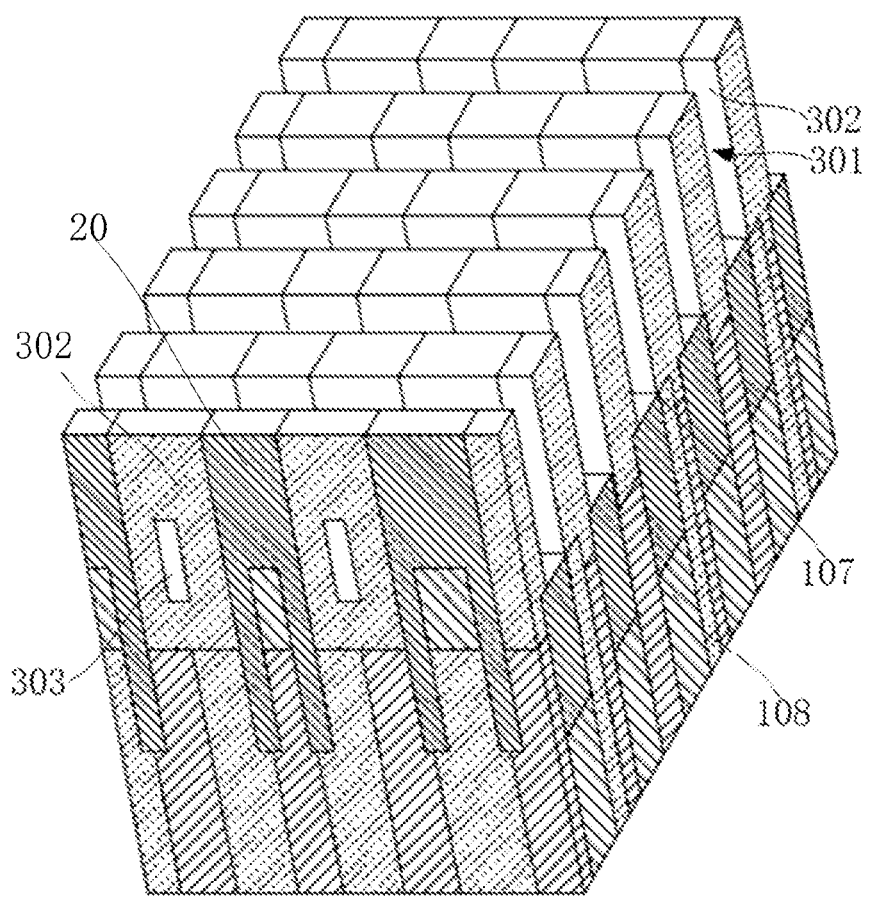
FIG. 26 is a schematic structural diagram after at least one slit is formed in a method for manufacturing a semiconductor structure provided by embodiments of the present disclosure.

Referring to FIG. 24 to FIG. 26, exemplarily, a lithography layer 40 can be firstly formed on each insulator 201 and each conductor 30, the lithography layer 40 has an etched pattern thereon, the etched pattern can include at least one hole located in the lithography layer 40, the at least one hole has a longitudinal direction perpendicular to that of the bit line 204. Afterwards, the conductor 30 is etched by using the lithography layer 40 as a mask, and each conductor 30 that corresponds to each hole is removed to form at least one slit 301 perpendicular to the longitudinal direction of the bit line 204. The at least one slit 301 divides the conductor 30 into a plurality of conductive blocks 302 that are provided at intervals. Exemplarily, in a process of etching the conductor 30, a portion of the insulator 201 can be etched to form a groove structure in the insulator 201. It is noteworthy that reasonably setting the etched pattern of the lithography layer 40 may allow each of the conductive blocks 302 to correspond to one of the capacitor connection holes 106 and cause each of the conductive blocks 302 to be connected to the capacitor contact structure 107 that corresponds to the capacitor connection hole 106.

In the method for manufacturing the semiconductor structure provided by the embodiment, the bit line structure 20 is formed on the substrate 10, the bit line structure 20 includes the plurality of bit lines 204 parallel to and spaced apart from each other, the sidewalls and the top portion of each of the plurality of bit lines 204 are wrapped with the insulating structure 206, and the fill channel is formed between the insulating structures on two adjacent bit lines. Afterwards, the conductor 30 is formed in the fill channel 207, and is connected to the transistors on the substrate 10. The at least one slit 301 is formed on the conductor 30 along a direction perpendicular to the longitudinal direction of the bit line 204 to divide the conductor 30 into the plurality of conductive blocks 302, each of the plurality of conductive blocks 302 is connected to one of the transistors on the substrate 10. Compared with the technical solutions of firstly forming the insulating structure 206 that has the plurality of holes on the substrate 10, and forming the capacitor connection line in the hole, when the conductor 30 is formed in the fill channel 207, the conductive material moves inwardly from the two opposite sidewalls of the fill channel 207, a sealing speed is relative slow, which reduces a gap 303 volume formed in the conductive block 302, thereby improving the performance of the semiconductor structure.

With continued reference to FIG. 24 to FIG. 26, in the above-mentioned implementation, in a process of forming the conductor 30, the at least one gap 303 is formed in the conductor 30, correspondingly, after the conductive blocks 302 are formed, at least one gap 303 is formed in each of the conductive blocks 302.

Figure 27:
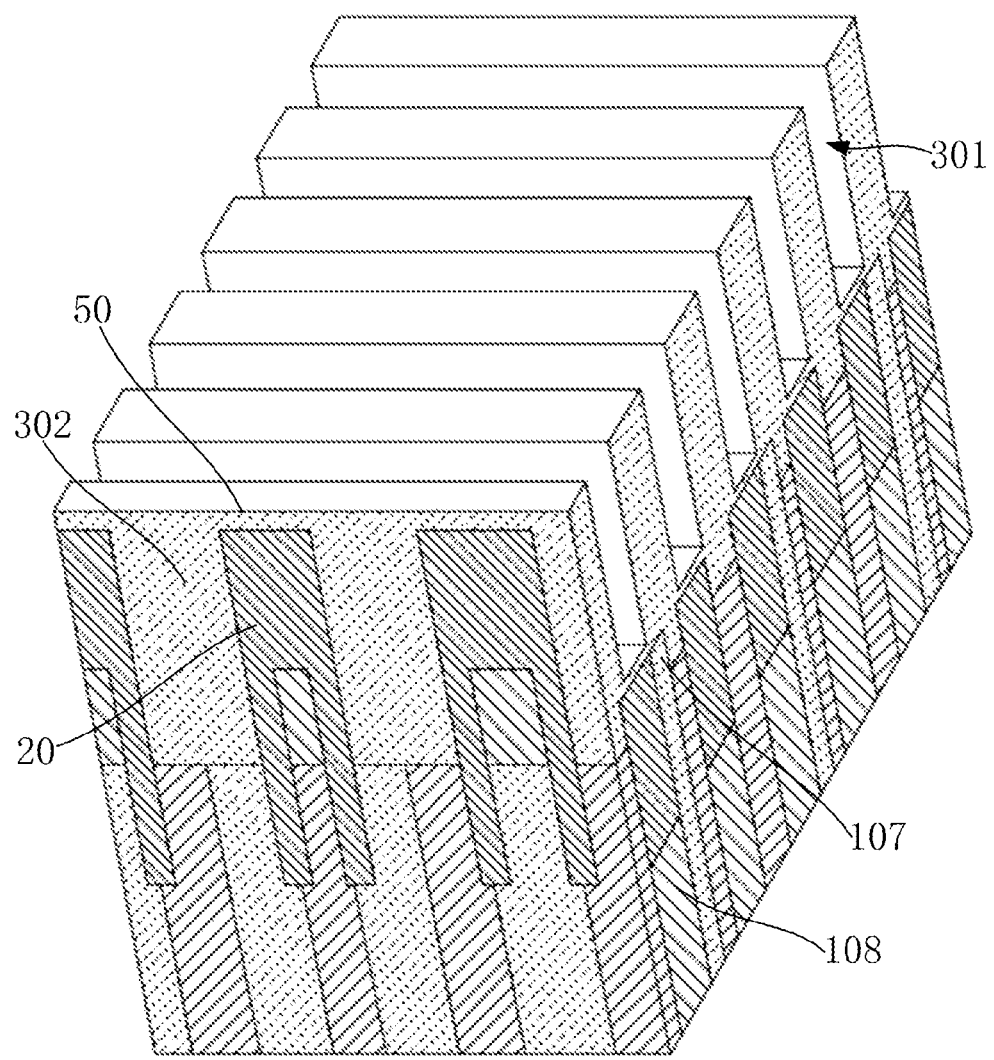
FIG. 27 is a schematic structural diagram after a conductive capping layer is formed in a method for manufacturing a semiconductor structure provided by embodiments of the present disclosure.

Referring to FIG. 27, after the at least one slit 301 is formed on the conductor 30 along a direction perpendicular to the longitudinal direction of the bit line 204 to form the plurality of conductive blocks 302 that are distributed at intervals on the substrate 10, the operations also include: a conductive capping layer 50 is formed on a top wall and sidewalls of each of the plurality of conductive blocks 302, and a portion of the conductive capping layer 50 is filled in the at least one gap 303.

As such, while the conductive capping layer 50 is formed on the sidewalls of the conductor 30 that is perpendicular to the substrate 10, the conductive capping layer 50 is filled within each gap 303, thereby eliminating the at least one gap 303 in the conductive block 302, and thus further improving the performance of the semiconductor structure.

Exemplarily, a material of the conductive capping layer 50 can include polysilicon, etc. Further, the material of the conductive capping layer 50 can be same as that of the conductor 30 so that the conductive capping layer 50 filled in the gap 303 can form an integral structure with the conductive block 302, thereby further improving the performance of the semiconductor structure.

In some embodiments, the conductive capping layer 50 can be formed by Low Pressure Chemical Vapor Deposition (LPCVD). As such, the conductive capping layer 50 has a low deposition rate so that the conductive capping layer 50 can completely fill up the gap 303 within the conductive block 302.

In some embodiments, when the conductive capping layer 50 is formed, the conductive capping layer 50 also covers the substrate 10 that corresponds to the at least one slit 301; after the conductive capping layer 50 is formed, the conductive capping layer 50 corresponding to the at least one slit 301 is removed to prevent the conductive capping layers 50 on both sides of each of the at least one slit 301 from being connected to each other.

Figure 28:
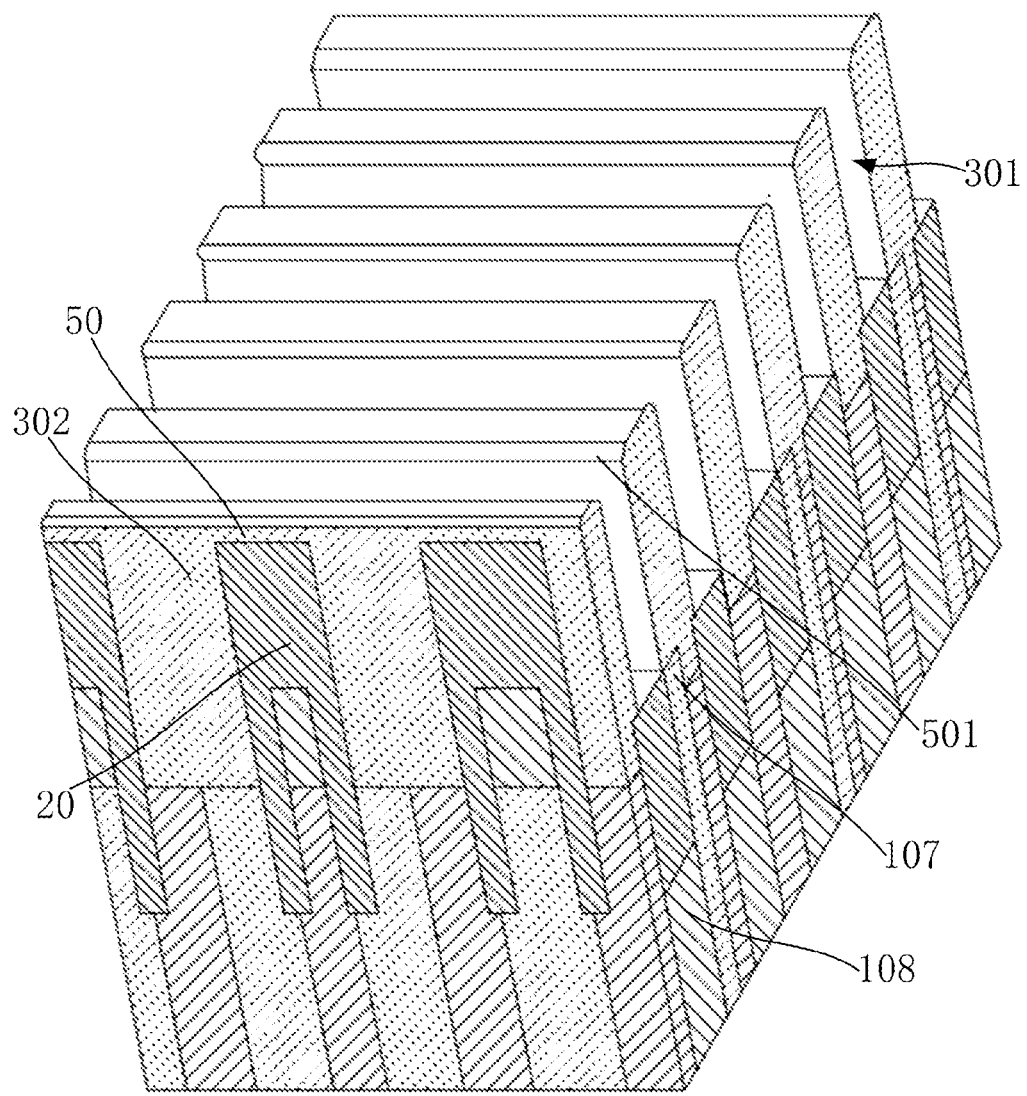
FIG. 28 is a schematic structural diagram after a fillet structure is formed in a method for manufacturing a semiconductor structure provided by embodiments of the present disclosure.
Figure 29:
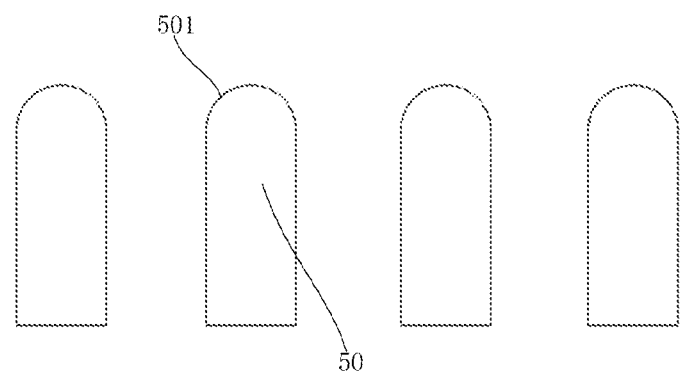
FIG. 29 is a fragmentary view of a fillet in FIG. 28.
Figure 30:
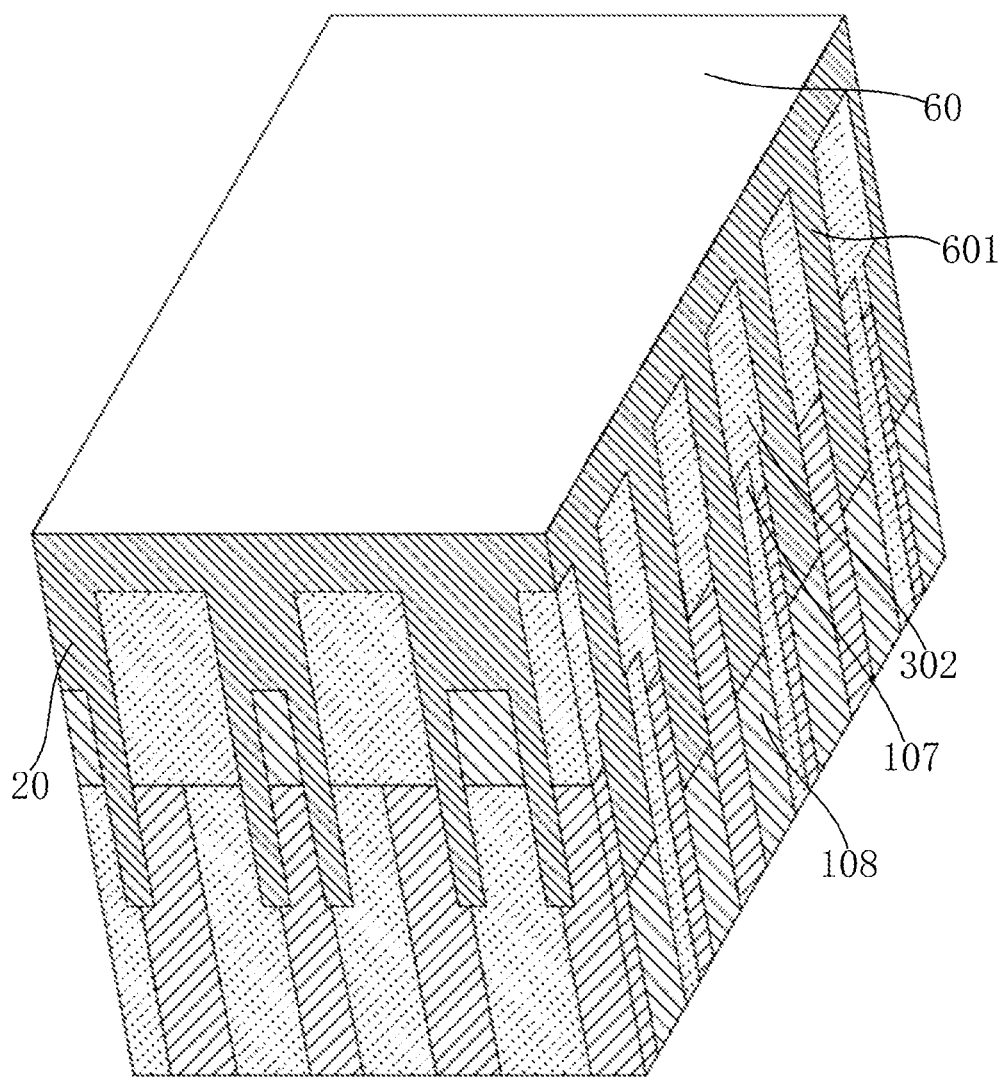
FIG. 30 is a schematic structural diagram after an insulating material layer is formed in a method for manufacturing a semiconductor structure provided by embodiments of the present disclosure.

Referring to FIG. 28 to FIG. 30, in some embodiments, after the conductive capping layer 50 on the substrate 10 that corresponds to the at least one slit 301 is removed, the method further includes: a portion of material at edges of the conductive capping layer; 50 is removed; then, the insulating block 601 is filled within the slit 301.

As such, removing the portion of material at the edge (an edge in a horizontal direction in FIG. 28) of the conductive capping layer 50 to form a fillet structure 501 increases a distance between the conductive capping layers 50 at sides of the adjacent conductive blocks 302 that are away from the substrate 10 and enlarges an opening area of an end of the slit 301 that is away from the substrate 10; when the insulating block 601 is formed, the sealing speed of the insulating block 601 can be retarded so as to prevent the gap from being formed in the insulating block 601, thereby improving the performance of the semiconductor structure.

Exemplarily, the portion of material at the edge of the conductive block 302 can be removed by etching to reduce the difficulty for manufacturing the semiconductor structure. Further, the conductive capping layer 50 on the substrate 10 that corresponds to the at least one slit 301 can be removed by etching, and while the conductive capping layer 50 on the substrate 10 is etched, the portion of material at edges of the conductive capping layer; 50 is removed, which further reduces the difficulty for manufacturing the semiconductor structure.

Figure 31:
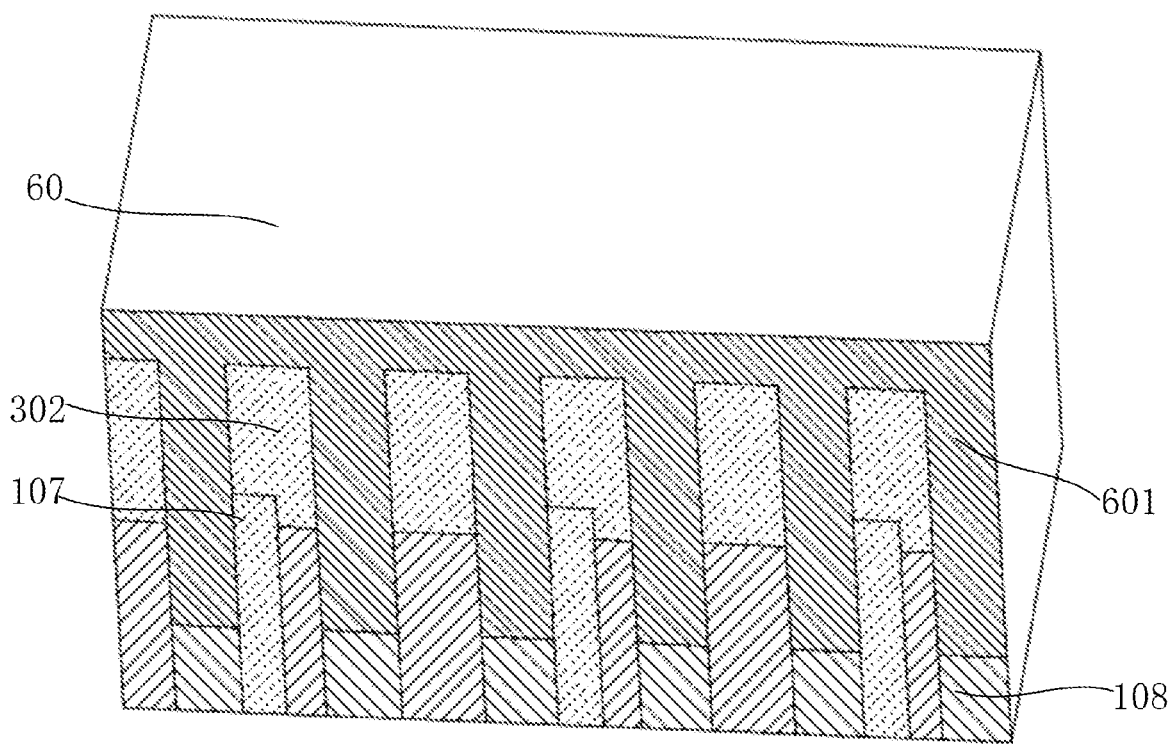
FIG. 31 is a schematic structural diagram after an insulating material layer is formed in a method for manufacturing a semiconductor structure provided by embodiments of the present disclosure.

Referring to FIG. 30 and FIG. 31, in the embodiment, filling the insulating block 601 in each of the at least one slit 301 includes: an insulating material layer 60 is formed, the insulating material layer 60 covers the top portions of the plurality of conductive blocks 302 and the bit line structure 20 that face away from the substrate 10, and the insulating material layer 60 fills the slit 301.

Exemplarily, the insulating material layer 60 can be formed by depositing; a material of the insulating material layer 60 can include silicon nitride, silicon oxide, or the like.

Figure 32:
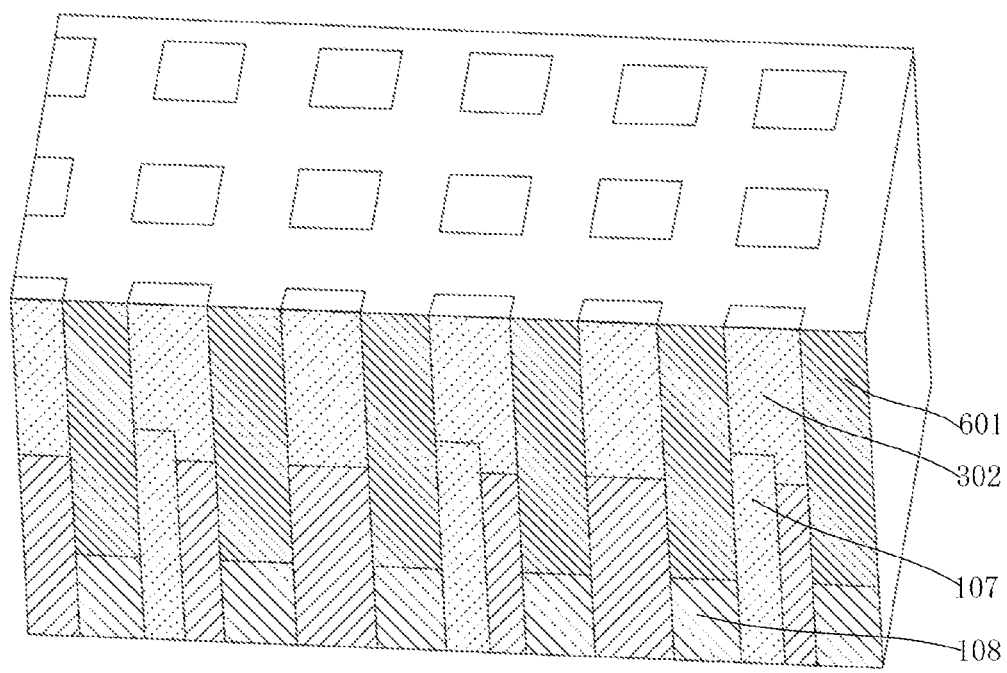
FIG. 32 is a schematic structural diagram after a portion of an insulating material layer is removed in a method for manufacturing a semiconductor structure provided by embodiments of the present disclosure.
Figure 33:
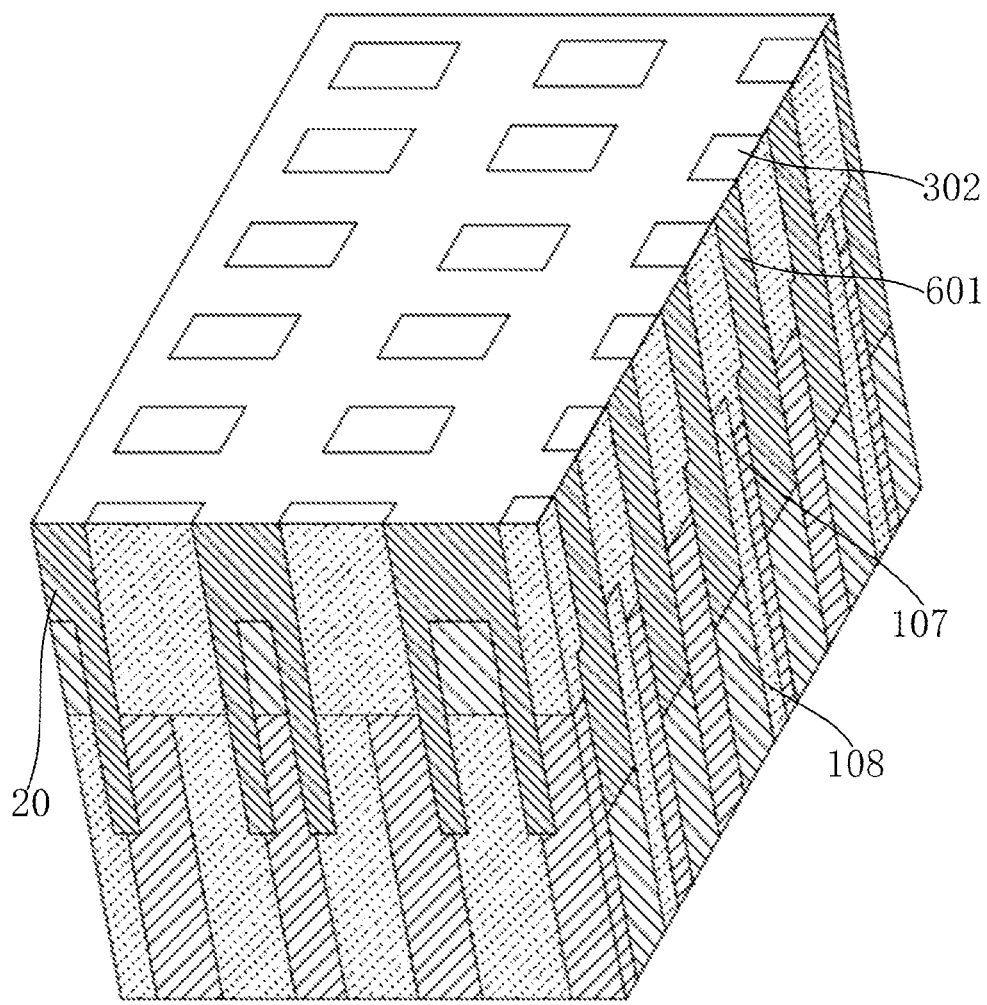
FIG. 33 is a schematic structural diagram after a portion of an insulating material layer is removed in a method for manufacturing a semiconductor structure provided by embodiments of the present disclosure.

As shown in FIG. 32 and FIG. 33, after the insulating material layer 60 is formed, the insulating material layer 60 that is located at the top portions (an end away from the substrate 10) of the conductive block 302 and the bit line structure 20 is removed to form the insulating block 601 in each of the at least one slit 301.

Exemplarily, the insulating material layer 60 that is located at the top portions of the conductive block 302 and the bit line structure 20 can be removed by Chemical Mechanical Polishing (CMP), or etching to expose the conductive block 302 so as to facilitate connection between the conductive block 302 and the capacitor structure.

The embodiment also provides a semiconductor structure, which may be manufactured through the method for manufacturing the semiconductor structure provided by any one of the above-mentioned embodiments. The semiconductor structure can be the DRAM. Of course, the semiconductor structure can also be another structure.

Referring to FIG. 2 to FIG. 33, in the semiconductor structure provided by the embodiment, the substrate 10 is provided with a plurality of conductive blocks 302 arranged at intervals, each of the plurality of conductive blocks 302 is configured to be connected to the capacitor structure and the transistor in the substrate 10. In the manufacturing process, a bit line structure 20 is formed on the substrate 10, the bit line structure 20 includes a plurality of bit lines 204 parallel to and spaced apart from each other, sidewalls and a top portion of the plurality of bit lines 204 are wrapped with the insulating structure 206, and a fill channel 207 is formed between the insulating structures 206 on two adjacent bit lines 204; afterwards, a conductor 30 is formed in the fill channel 207, and is connected to the transistor in the substrate 10; at least one slit 301 is formed in the conductor 30 along a direction perpendicular to the longitudinal direction of the bit line 204 to divide the conductor 30 into the plurality of conductive blocks 302, each of the conductive blocks 302 is connected to one of the transistors in the substrate 10. Compared with the technical solutions of firstly forming the insulating structure 206 that has the plurality of holes on the substrate 10, and forming the capacitor connection line in the hole, when the conductor 30 is formed in the fill channel 207, the conductive material moves inwardly from two opposite sidewalls of the fill channel 207, the sealing speed of the conductive material is relative slow, which reduces the gap 303 volume formed within the conductive block 302, thereby improving the performance of the semiconductor structure.

Finally, it is to be noted that the above embodiments are only intended to illustrate the technical solutions of the present disclosure instead of limiting them. Although the present disclosure has been explained in greater detail with reference to the foregoing various embodiments, one of ordinary skill in the art will appreciate that the technical solution described in the foregoing embodiments may still be modified, or equivalent alterations may be done to part or all of the technical features. These modification or alterations will not deviate the nature of the corresponding technical solution from the scope of the technical solutions of various embodiments of the present disclosure.

What is claimed is:

1. A method for manufacturing a semiconductor structure, comprising:
    providing a substrate;
    forming a bit line structure on the substrate, the bit line structure comprising a plurality of bit lines parallel to and spaced apart from each other, sidewalls and a top portion of each of the plurality of bit lines being wrapped with an insulating structure, and a fill channel being formed between the insulating structures on two adjacent bit lines;
    filling the fill channel with a conductive material to form a conductor; the conductor being connected to transistors on the substrate; and
    forming at least one slit on the conductor along a direction perpendicular to a longitudinal direction of each of the plurality of bit lines to form a plurality of conductive blocks distributed at intervals on the substrate, each of the plurality of conductive blocks being connected to one of the transistors on the substrate.

2. The method for manufacturing the semiconductor structure according to claim 1, wherein
    there is at least one gap in the conductor;

after forming the at least one slit on the conductor along the direction perpendicular to the longitudinal direction of each of the plurality of bit lines to form the plurality of conductive blocks distributed at intervals on the substrate, further comprising:

forming a conductive capping layer on a top wall and sidewalls of each of the plurality of conductive blocks, a portion of the conductive capping layer being filled in the at least one gap.

3. The method for manufacturing the semiconductor structure according to claim 2, wherein
the conductive capping layer is formed by Low Pressure Chemical Vapor Deposition (LPCVD).

4. The method for manufacturing the semiconductor structure according to claim 2, wherein
the conductive capping layer also covers the substrate that corresponds to the at least one slit;
after forming the conductive capping layer, further comprises: removing the conductive capping layer on the substrate that corresponds to the at least one slit.

5. The method for manufacturing the semiconductor structure according to claim 4, wherein
after removing the conductive capping layer on the substrate that corresponds to the at least one slit, further comprising:
removing a portion of material at edges of the conductive capping layer; and
filling an insulating block in each of the at least one slit.

6. The method for manufacturing the semiconductor structure according to claim 5, wherein
the conductive capping layer on the substrate that corresponds to the at least one slit is removed by etching, and while the conductive capping layer on the substrate is etched, the portion of material at edges of the conductive capping layer is removed.

7. The method for manufacturing the semiconductor structure according to claim 5, wherein
filling the insulating block in each of the at least one slit comprises:
forming an insulating material layer, the insulating material layer covering top portions of the plurality of conductive blocks and the bit line structure that face away from the substrate, and the insulating material layer filling the at least one slit.

8. The method for manufacturing the semiconductor structure according to claim 7, after forming the insulating material layer further comprising:
removing the insulating material layer that is located at the top portions of the plurality of conductive blocks and the bit line structure to form the insulating block in each of the at least one slit.

9. The method for manufacturing the semiconductor structure according to claim 1, wherein
forming the bit line structure on the substrate comprises:
forming and stacking subsequently a bit line layer and an insulating capping layer on the substrate;
removing a portion of the insulating capping layer and a portion of the bit line layer to form the plurality of bit lines parallel to and spaced apart from each other, and each of the plurality of bit lines has an insulator at a side facing away from the substrate; and forming an insulating sidewall on side surfaces of each of the plurality of bit lines and side surfaces of the insulator, the insulating sidewall and the insulator constituting the insulating structure.

10. The method for manufacturing the semiconductor structure according to claim 9, wherein
before forming the bit line structure on the substrate comprises:
forming an insulating layer on the substrate;
forming at least one bit line contact hole in the insulating layer, and each of the at least one bit line contact hole extending to a bit line connection structure on the substrate;
forming a bit line contact plug in each of the at least one bit line contact hole; and
forming the plurality of bit lines comprising: each of the plurality of bit lines covering at least a portion the bit line contact plug.

11. The method for manufacturing the semiconductor structure according to claim 10, wherein
after removing the portion of the insulating capping layer and the portion of the bit line layer to form the plurality of bit lines parallel to and spaced apart from each other, further comprises:
removing the insulating layer between every two adjacent bit lines to form at least one groove; and
forming the insulating sidewall on side surfaces of each of the plurality of bit lines that is perpendicular to the substrate comprising: a portion of the insulating sidewall being filled in each of the at least one groove.

12. The method for manufacturing the semiconductor structure according to claim 11, wherein
after forming the insulating sidewall further comprises:
forming at least one capacitor connection hole on the insulating sidewall that corresponds to each of the at least one groove, each of the at least one capacitor connection hole extending to a capacitor contact structure in the substrate; and
filling the fill channel with the conductive material to form the conductor comprising: a portion of the conductor being filled in each of the at least one capacitor connection hole so as to be bonded to the capacitor contact structure.

13. The method for manufacturing the semiconductor structure according to claim 9, wherein
the step of forming the insulating sidewall on the side surfaces of each of the plurality of bit lines and side surfaces of the insulator comprises:
forming subsequently a first insulating sidewall, a second insulating sidewall, and a third insulating sidewall on the side surfaces of each of the plurality of bit lines and side surfaces of the insulator, a material of the first insulating sidewall being the same as a material of the third insulating sidewall, and a material of the second insulating sidewall being different from the material of the first insulating sidewall.

14. The method for manufacturing the semiconductor structure according to claim 13, wherein
both the first insulating sidewall and the third insulating sidewall are silicon nitride sidewalls, and the second insulating sidewall is a silicon oxide sidewall.

* * * * *